United States Patent
Pederson et al.

(10) Patent No.: US 9,324,598 B2
(45) Date of Patent: Apr. 26, 2016

(54) SUBSTRATE PROCESSING SYSTEM AND METHOD

(71) Applicant: INTEVAC, INC., Santa Clara, CA (US)

(72) Inventors: Terry Pederson, Sunnyvale, CA (US); Henry Hieslmair, Sunnyvale, CA (US); Moon Chun, San Jose, CA (US); Vinay Prabhakar, Cupertino, CA (US); Babak Adibi, Los Altos, CA (US); Terry Bluck, Santa Clara, CA (US)

(73) Assignee: INTEVAC, INC., Santa Clara, CA (US)

( * ) Notice: Subject to any disclaimer, the term of this patent is extended or adjusted under 35 U.S.C. 154(b) by 162 days.

(21) Appl. No.: 13/672,652

(22) Filed: Nov. 8, 2012

(65) Prior Publication Data
US 2013/0115764 A1 May 9, 2013

Related U.S. Application Data

(60) Provisional application No. 61/557,363, filed on Nov. 8, 2011.

(51) Int. Cl.
*H01L 21/677* (2006.01)
*H01L 21/265* (2006.01)
(Continued)

(52) U.S. Cl.
CPC .... *H01L 21/67745* (2013.01); *H01L 21/26506* (2013.01); *H01L 21/6776* (2013.01);
(Continued)

(58) Field of Classification Search
CPC .................. H01L 21/67745; H01L 21/26506; H01L 21/6776; H01L 21/6831; H01L 31/1876; H01L 21/681; Y02E 10/50
USPC ............... 438/514; 118/50.1, 500, 723, 712; 204/298.06, 298.07, 298.15, 298.23, 204/298.29, 298.26
See application file for complete search history.

(56) References Cited

U.S. PATENT DOCUMENTS

| | | |
|---|---|---|
| 3,607,450 A | 9/1971 | Kiewit |
| 3,786,359 A | 1/1974 | King |

(Continued)

FOREIGN PATENT DOCUMENTS

| | | |
|---|---|---|
| CN | 1198597 A | 11/1998 |
| CN | 1404619 A | 3/2003 |

(Continued)

OTHER PUBLICATIONS

Office Action in U.S. Appl. No. 13/312,957, dated Dec. 15, 2014.
(Continued)

*Primary Examiner* — John Brayton
(74) *Attorney, Agent, or Firm* — Nixon Peabody LLP; Joseph Bach, Esq.

(57) ABSTRACT

A system for processing substrates has a vacuum enclosure and a processing chamber situated to process wafers in a processing zone inside the vacuum enclosure. Two rail assemblies are provided, one on each side of the processing zone. Two chuck arrays ride, each on one of the rail assemblies, such that each is cantilevered on one rail assemblies and support a plurality of chucks. The rail assemblies are coupled to an elevation mechanism that places the rails in upper position for processing and at lower position for returning the chuck assemblies for loading new wafers. A pickup head assembly loads wafers from a conveyor onto the chuck assemblies. The pickup head has plurality of electrostatic chucks that pick up the wafers from the front side of the wafers. Cooling channels in the processing chucks are used to create air cushion to assist in aligning the wafers when delivered by the pickup head.

19 Claims, 8 Drawing Sheets

(51) Int. Cl.
  *H01L 21/68*    (2006.01)
  *H01L 31/18*    (2006.01)
  *H01L 21/683*   (2006.01)

(52) U.S. Cl.
  CPC .......... *H01L21/681* (2013.01); *H01L 31/1876* (2013.01); *H01L 21/6831* (2013.01); *Y02E 10/50* (2013.01); *Y02P 70/521* (2015.11)

(56) References Cited

U.S. PATENT DOCUMENTS

| | | |
|---|---|---|
| 3,790,412 A | 2/1974 | Moline |
| 3,948,682 A | 4/1976 | Bordina et al. |
| 3,969,163 A | 7/1976 | Wakefield |
| 3,969,746 A | 7/1976 | Kendall et al. |
| 3,976,508 A | 8/1976 | Mlavsky |
| 4,001,864 A | 1/1977 | Gibbons |
| 4,004,949 A | 1/1977 | Lesk |
| 4,021,276 A | 5/1977 | Cho et al. |
| 4,029,518 A | 6/1977 | Matsutani et al. |
| 4,056,404 A | 11/1977 | Garone et al. |
| 4,070,205 A | 1/1978 | Rahilly |
| 4,070,689 A | 1/1978 | Coleman et al. |
| 4,072,541 A | 2/1978 | Meulenberg, Jr. et al. |
| 4,086,102 A | 4/1978 | King |
| 4,090,213 A | 5/1978 | Maserjian et al. |
| 4,095,329 A | 6/1978 | Ravi |
| 4,116,717 A | 9/1978 | Rahilly |
| RE29,833 E | 11/1978 | Mlavsky |
| 4,131,486 A | 12/1978 | Brandhorst, Jr. |
| 4,131,488 A | 12/1978 | Lesk et al. |
| 4,141,756 A | 2/1979 | Chiang et al. |
| 4,144,094 A | 3/1979 | Coleman et al. |
| 4,152,536 A | 5/1979 | Ravi |
| 4,152,824 A | 5/1979 | Gonsiorawski |
| 4,179,311 A | 12/1979 | Athanas |
| 4,219,830 A | 8/1980 | Gibbons |
| 4,227,941 A | 10/1980 | Bozler et al. |
| 4,253,881 A | 3/1981 | Hezel |
| 4,273,950 A | 6/1981 | Chitre |
| 4,295,002 A | 10/1981 | Chappell et al. |
| 4,301,592 A | 11/1981 | Lin |
| 4,322,571 A | 3/1982 | Stanbery |
| 4,353,160 A | 10/1982 | Armini et al. |
| RE31,151 E | 2/1983 | King |
| 4,377,722 A | 3/1983 | Wested |
| 4,379,944 A | 4/1983 | Borden et al. |
| 4,404,422 A | 9/1983 | Green et al. |
| 4,421,577 A | 12/1983 | Spicer |
| 4,428,783 A | 1/1984 | Gessert |
| 4,448,865 A | 5/1984 | Bohlen et al. |
| 4,449,286 A | 5/1984 | Dahlberg |
| 4,456,489 A | 6/1984 | Wu |
| 4,479,027 A | 10/1984 | Todorof |
| 4,490,573 A | 12/1984 | Gibbons |
| 4,495,375 A | 1/1985 | Rickus et al. |
| 4,522,657 A | 6/1985 | Rohatgi et al. |
| 4,523,971 A | 6/1985 | Cuomo et al. |
| 4,524,237 A | 6/1985 | Ross et al. |
| 4,533,831 A | 8/1985 | Itoh et al. |
| 4,539,431 A | 9/1985 | Moddel et al. |
| 4,540,843 A | 9/1985 | Gochermann et al. |
| 4,542,256 A | 9/1985 | Wiedeman |
| 4,581,620 A | 4/1986 | Yamazaki et al. |
| 4,587,430 A | 5/1986 | Adler |
| 4,589,191 A | 5/1986 | Green et al. |
| 4,633,138 A | 12/1986 | Tokiguchi et al. |
| 4,665,277 A | 5/1987 | Sah et al. |
| 4,667,060 A | 5/1987 | Spitzer |
| 4,676,845 A | 6/1987 | Spitzer |
| 4,681,983 A | 7/1987 | Markvart et al. |
| 4,719,355 A | 1/1988 | Meyers et al. |
| 4,737,688 A | 4/1988 | Collins et al. |
| 4,742,381 A | 5/1988 | Fujii |
| 4,758,525 A | 7/1988 | Kida et al. |
| 4,828,628 A | 5/1989 | Hezel et al. |
| 4,830,678 A | 5/1989 | Todorof et al. |
| 4,834,805 A | 5/1989 | Erbert |
| 4,847,504 A | 7/1989 | Aitken |
| 4,886,555 A | 12/1989 | Hackstein et al. |
| 4,900,369 A | 2/1990 | Hezel et al. |
| 4,927,770 A | 5/1990 | Swanson |
| 4,933,021 A | 6/1990 | Swanson |
| 4,933,022 A | 6/1990 | Swanson |
| 4,967,088 A | 10/1990 | Stengl et al. |
| 5,009,720 A | 4/1991 | Hokuyo et al. |
| 5,112,409 A | 5/1992 | Warfield et al. |
| 5,125,983 A | 6/1992 | Cummings |
| 5,132,544 A | 7/1992 | Glavish |
| 5,136,171 A | 8/1992 | Leung et al. |
| 5,290,367 A | 3/1994 | Hayashi et al. |
| 5,306,647 A | 4/1994 | Lehmann et al. |
| 5,330,584 A | 7/1994 | Saga et al. |
| 5,340,454 A * | 8/1994 | Schaefer ............... C23C 14/568 |
| | | 204/192.12 |
| 5,356,488 A | 10/1994 | Hezel |
| 5,374,456 A | 12/1994 | Matossian et al. |
| 5,391,886 A | 2/1995 | Yamada et al. |
| 5,421,889 A | 6/1995 | Pollack et al. |
| 5,516,725 A | 5/1996 | Chang et al. |
| 5,554,854 A | 9/1996 | Blake |
| 5,583,368 A | 12/1996 | Kenney |
| H0001637 H | 3/1997 | Offord et al. |
| 5,641,362 A | 6/1997 | Meier |
| 5,693,376 A | 12/1997 | Fetherston et al. |
| 5,760,405 A | 6/1998 | King et al. |
| 5,831,321 A | 11/1998 | Nagayama |
| 5,883,391 A | 3/1999 | Adibi et al. |
| 5,885,896 A | 3/1999 | Thakur et al. |
| 5,907,158 A | 5/1999 | Nasser-Ghodsi et al. |
| 5,932,882 A | 8/1999 | England et al. |
| 5,935,345 A | 8/1999 | Kuznicki |
| 5,945,012 A | 8/1999 | Chan |
| 5,963,801 A | 10/1999 | Aronowitz et al. |
| 5,969,366 A | 10/1999 | England et al. |
| 5,985,742 A | 11/1999 | Henley et al. |
| 5,988,103 A | 11/1999 | Fetherston et al. |
| 5,994,207 A | 11/1999 | Henley et al. |
| 5,998,282 A | 12/1999 | Lukaszek |
| 5,999,268 A | 12/1999 | Yonezawa et al. |
| 6,006,253 A | 12/1999 | Kumar et al. |
| 6,010,579 A | 1/2000 | Henley et al. |
| 6,013,563 A | 1/2000 | Henley et al. |
| 6,016,036 A | 1/2000 | Brailove |
| 6,033,974 A | 3/2000 | Henley et al. |
| 6,034,321 A | 3/2000 | Jenkins |
| 6,048,411 A | 4/2000 | Henley et al. |
| 6,051,073 A | 4/2000 | Chu et al. |
| 6,060,718 A | 5/2000 | Brailove et al. |
| 6,083,324 A | 7/2000 | Henley et al. |
| 6,084,175 A | 7/2000 | Perry et al. |
| 6,091,021 A | 7/2000 | Ruby et al. |
| 6,092,485 A * | 7/2000 | Ando ............... H01L 21/67213 |
| | | 118/723 FI |
| 6,093,625 A | 7/2000 | Wagner et al. |
| 6,103,599 A | 8/2000 | Henley et al. |
| 6,113,735 A | 9/2000 | Chu et al. |
| 6,120,660 A | 9/2000 | Chu et al. |
| 6,130,380 A | 10/2000 | Nakamura |
| 6,138,606 A | 10/2000 | Ling |
| 6,146,462 A | 11/2000 | Yializis et al. |
| 6,146,979 A | 11/2000 | Henley et al. |
| 6,150,708 A | 11/2000 | Gardner et al. |
| 6,153,524 A | 11/2000 | Henley et al. |
| 6,155,909 A | 12/2000 | Henley et al. |
| 6,159,824 A | 12/2000 | Henley et al. |
| 6,159,825 A | 12/2000 | Henley et al. |
| 6,162,705 A | 12/2000 | Henley et al. |
| 6,171,965 B1 | 1/2001 | Kang et al. |
| 6,180,496 B1 | 1/2001 | Farrens et al. |
| 6,184,111 B1 | 2/2001 | Henley et al. |
| 6,186,091 B1 | 2/2001 | Chu et al. |
| 6,200,883 B1 | 3/2001 | Taylor et al. |
| 6,204,151 B1 | 3/2001 | Malik et al. |

(56) References Cited

U.S. PATENT DOCUMENTS

| | | |
|---|---|---|
| 6,206,973 B1 | 3/2001 | Bailey et al. |
| 6,207,005 B1 | 3/2001 | Henley et al. |
| 6,213,050 B1 | 4/2001 | Liu et al. |
| 6,217,724 B1 | 4/2001 | Chu et al. |
| 6,221,740 B1 | 4/2001 | Bryan et al. |
| 6,221,774 B1 | 4/2001 | Malik |
| 6,228,176 B1 | 5/2001 | Chu et al. |
| 6,238,582 B1 | 5/2001 | Williams et al. |
| 6,245,161 B1 | 6/2001 | Henley et al. |
| 6,248,649 B1 | 6/2001 | Henley et al. |
| 6,258,173 B1 | 7/2001 | Kirimura et al. |
| 6,263,941 B1 | 7/2001 | Bryan et al. |
| 6,265,328 B1 | 7/2001 | Henley et al. |
| 6,269,765 B1 | 8/2001 | Chu et al. |
| 6,271,566 B1 | 8/2001 | Tsuchiaki |
| 6,274,459 B1 | 8/2001 | Chan |
| 6,281,428 B1 | 8/2001 | Chiu et al. |
| 6,287,941 B1 | 9/2001 | Kang et al. |
| 6,290,804 B1 | 9/2001 | Henley et al. |
| 6,291,313 B1 | 9/2001 | Henley et al. |
| 6,291,314 B1 | 9/2001 | Henley et al. |
| 6,291,326 B1 | 9/2001 | Henley et al. |
| 6,294,434 B1 | 9/2001 | Tseng |
| 6,300,227 B1 | 10/2001 | Liu et al. |
| 6,313,905 B1 | 11/2001 | Brugger et al. |
| 6,321,134 B1 | 11/2001 | Henley et al. |
| 6,335,534 B1 | 1/2002 | Suguro et al. |
| 6,338,313 B1 | 1/2002 | Chan |
| 6,365,492 B1 | 4/2002 | Suguro et al. |
| 6,383,876 B1 | 5/2002 | Son et al. |
| 6,391,740 B1 | 5/2002 | Cheung et al. |
| 6,417,515 B1 | 7/2002 | Barrett et al. |
| 6,429,037 B1 | 8/2002 | Wenham et al. |
| 6,448,152 B1 | 9/2002 | Henley et al. |
| 6,458,430 B1 | 10/2002 | Bernstein et al. |
| 6,458,723 B1 | 10/2002 | Henley et al. |
| 6,468,884 B2 | 10/2002 | Miyake et al. |
| 6,476,313 B2 | 11/2002 | Kawano |
| 6,486,478 B1 | 11/2002 | Libby et al. |
| 6,489,241 B1 | 12/2002 | Thilderkvist et al. |
| 6,495,010 B2 | 12/2002 | Sferlazzo |
| 6,500,732 B1 | 12/2002 | Henley et al. |
| 6,507,689 B2 | 1/2003 | Tirloni et al. |
| 6,534,381 B2 | 3/2003 | Cheung et al. |
| 6,544,862 B1 | 4/2003 | Bryan |
| 6,552,259 B1 | 4/2003 | Hosomi et al. |
| 6,552,414 B1 | 4/2003 | Horzel et al. |
| 6,594,579 B1 | 7/2003 | Lowrey et al. |
| 6,600,180 B1 | 7/2003 | Ueno et al. |
| 6,604,033 B1 | 8/2003 | Banet et al. |
| 6,611,740 B2 | 8/2003 | Lowrey et al. |
| 6,613,974 B2 | 9/2003 | Husher |
| 6,632,324 B2 | 10/2003 | Chan |
| 6,636,790 B1 | 10/2003 | Lightner et al. |
| 6,660,928 B1 | 12/2003 | Patton et al. |
| 6,732,031 B1 | 5/2004 | Lightner et al. |
| 6,752,912 B1 | 6/2004 | Sandhu |
| 6,759,807 B2 | 7/2004 | Wahlin |
| 6,767,439 B2 | 7/2004 | Park |
| 6,780,759 B2 | 8/2004 | Farrens et al. |
| 6,787,693 B2 | 9/2004 | Lizotte |
| 6,825,102 B1 | 11/2004 | Bedell |
| 6,827,824 B1 | 12/2004 | Blalock et al. |
| 6,874,515 B2 | 4/2005 | Ishihara et al. |
| 6,878,898 B2 | 4/2005 | Hogan et al. |
| 6,949,895 B2 | 9/2005 | DiVergilio et al. |
| 6,968,630 B2 | 11/2005 | Kato et al. |
| 7,011,733 B2 | 3/2006 | Sandhu |
| 7,022,984 B1 | 4/2006 | Rathmell et al. |
| 7,045,793 B2 | 5/2006 | Wahlin |
| 7,066,703 B2 | 6/2006 | Johnson |
| 7,078,317 B2 | 7/2006 | Henley |
| 7,081,186 B2 | 7/2006 | Ehiasarian et al. |
| 7,094,666 B2 | 8/2006 | Henley et al. |
| 7,098,394 B2 | 8/2006 | Armer et al. |
| 7,147,709 B1 | 12/2006 | Ong et al. |
| 7,166,520 B1 | 1/2007 | Henley |
| 7,174,243 B1 | 2/2007 | Lightner et al. |
| 7,225,047 B2 | 5/2007 | Al-Bayati et al. |
| 7,225,065 B1 | 5/2007 | Hunt et al. |
| 7,228,211 B1 | 6/2007 | Lowrey et al. |
| 7,250,323 B2 | 7/2007 | Gadeken et al. |
| 7,339,110 B1 | 3/2008 | Mulligan et al. |
| 7,354,815 B2 | 4/2008 | Henley |
| 7,390,724 B2 | 6/2008 | Henley et al. |
| 7,399,680 B2 | 7/2008 | Henley |
| 7,427,554 B2 | 9/2008 | Henley et al. |
| 7,447,574 B1 | 11/2008 | Washicko et al. |
| 7,477,968 B1 | 1/2009 | Lowrey et al. |
| 7,479,441 B2 | 1/2009 | Kirk et al. |
| 7,480,551 B1 | 1/2009 | Lowrey et al. |
| 7,498,245 B2 | 3/2009 | Aspar et al. |
| 7,521,699 B2 | 4/2009 | Yamazaki et al. |
| 7,523,159 B1 | 4/2009 | Williams et al. |
| 7,532,962 B1 | 5/2009 | Lowrey et al. |
| 7,532,963 B1 | 5/2009 | Lowrey et al. |
| 7,547,609 B2 | 6/2009 | Henley |
| 7,564,042 B2 | 7/2009 | Lee et al. |
| 7,598,153 B2 | 10/2009 | Henley et al. |
| 7,611,322 B2 | 11/2009 | Bluck et al. |
| 7,674,687 B2 | 3/2010 | Henley |
| 7,701,011 B2 | 4/2010 | Kamath et al. |
| 7,727,866 B2 | 6/2010 | Bateman et al. |
| 7,759,220 B2 | 7/2010 | Henley |
| 7,767,561 B2 | 8/2010 | Hanawa et al. |
| 7,772,088 B2 | 8/2010 | Henley et al. |
| 7,776,727 B2 | 8/2010 | Borden |
| 7,796,849 B2 | 9/2010 | Adibi et al. |
| 7,862,683 B2 | 1/2011 | Fukiage |
| 7,867,409 B2 | 1/2011 | Brcka |
| 8,058,156 B2 | 11/2011 | Hanawa et al. |
| 8,179,530 B2 | 5/2012 | Levy et al. |
| 8,286,517 B2 | 10/2012 | Lee et al. |
| 8,697,552 B2 | 4/2014 | Adibi et al. |
| 8,697,553 B2 | 4/2014 | Adibi et al. |
| 8,749,053 B2 | 6/2014 | Adibi et al. |
| 8,871,619 B2 | 10/2014 | Adibi et al. |
| 8,997,688 B2 | 4/2015 | Adibi et al. |
| 2001/0002584 A1 | 6/2001 | Liu et al. |
| 2001/0017109 A1 | 8/2001 | Liu et al. |
| 2001/0020485 A1 | 9/2001 | Ford et al. |
| 2002/0090758 A1 | 7/2002 | Henley et al. |
| 2002/0109233 A1 | 8/2002 | Farrar |
| 2002/0109824 A1 | 8/2002 | Yamaguchi |
| 2002/0139666 A1 | 10/2002 | Hsueh et al. |
| 2002/0144725 A1 | 10/2002 | Jordan et al. |
| 2002/0152057 A1 | 10/2002 | Wang et al. |
| 2002/0185700 A1 | 12/2002 | Coffa et al. |
| 2003/0015700 A1 | 1/2003 | Eisenbeiser et al. |
| 2003/0106643 A1 | 6/2003 | Tabuchi et al. |
| 2003/0116090 A1 | 6/2003 | Chu et al. |
| 2003/0129045 A1 | 7/2003 | Bonora et al. |
| 2003/0137050 A1 | 7/2003 | Chambers et al. |
| 2003/0215991 A1 | 11/2003 | Sohn et al. |
| 2003/0230986 A1 | 12/2003 | Horsky et al. |
| 2004/0025791 A1 | 2/2004 | Chen et al. |
| 2004/0025932 A1 | 2/2004 | Husher |
| 2004/0067644 A1 | 4/2004 | Malik et al. |
| 2004/0112426 A1 | 6/2004 | Hagino |
| 2004/0123804 A1* | 7/2004 | Yamazaki et al. ...... 118/723 VE |
| 2004/0185644 A1 | 9/2004 | Shibata et al. |
| 2004/0187916 A1 | 9/2004 | Hezel |
| 2004/0198028 A1 | 10/2004 | Tanaka et al. |
| 2004/0200520 A1 | 10/2004 | Mulligan et al. |
| 2004/0216993 A1 | 11/2004 | Sandhu |
| 2004/0232414 A1 | 11/2004 | Suthar et al. |
| 2005/0045835 A1 | 3/2005 | DiVergilio et al. |
| 2005/0133084 A1 | 6/2005 | Joge et al. |
| 2005/0150597 A1 | 7/2005 | Henley et al. |
| 2005/0163598 A1* | 7/2005 | Yuasa et al. ................... 414/217 |
| 2005/0181584 A1 | 8/2005 | Foad et al. |
| 2005/0183670 A1 | 8/2005 | Grantham et al. |
| 2005/0205211 A1 | 9/2005 | Singh et al. |
| 2005/0211170 A1 | 9/2005 | Hanawa et al. |

(56) References Cited

U.S. PATENT DOCUMENTS

| | | |
|---|---|---|
| 2005/0214477 A1 | 9/2005 | Hanawa et al. |
| 2005/0247668 A1 | 11/2005 | Malik et al. |
| 2005/0266781 A1 | 12/2005 | Jaenen et al. |
| 2006/0019039 A1 | 1/2006 | Hanawa et al. |
| 2006/0019477 A1 | 1/2006 | Hanawa et al. |
| 2006/0037700 A1 | 2/2006 | Shi et al. |
| 2006/0081180 A1 | 4/2006 | Aoki et al. |
| 2006/0144335 A1 | 7/2006 | Lee et al. |
| 2006/0148241 A1 | 7/2006 | Brody et al. |
| 2006/0157733 A1 | 7/2006 | Lucovsky et al. |
| 2006/0166394 A1 | 7/2006 | Kukulka et al. |
| 2006/0174829 A1* | 8/2006 | An et al. ............ 118/52 |
| 2006/0211219 A1 | 9/2006 | Henley et al. |
| 2006/0234484 A1 | 10/2006 | Lanzerotti et al. |
| 2006/0252217 A1 | 11/2006 | Rouh et al. |
| 2006/0279970 A1 | 12/2006 | Kernahan |
| 2007/0012503 A1 | 1/2007 | Iida |
| 2007/0029043 A1 | 2/2007 | Henley |
| 2007/0032044 A1 | 2/2007 | Henley |
| 2007/0035847 A1 | 2/2007 | Li et al. |
| 2007/0068624 A1 | 3/2007 | Jeon et al. |
| 2007/0081138 A1 | 4/2007 | Kerkhof et al. |
| 2007/0084505 A1 | 4/2007 | Zaidi |
| 2007/0087574 A1 | 4/2007 | Gupta et al. |
| 2007/0089833 A1 | 4/2007 | Inouchi et al. |
| 2007/0119373 A1 | 5/2007 | Kumar et al. |
| 2007/0132368 A1 | 6/2007 | Kuwahara et al. |
| 2007/0134840 A1 | 6/2007 | Gadeken et al. |
| 2007/0148336 A1 | 6/2007 | Bachrach et al. |
| 2007/0169806 A1 | 7/2007 | Fork et al. |
| 2007/0181820 A1 | 8/2007 | Hwang et al. |
| 2007/0181829 A1 | 8/2007 | Tanaka et al. |
| 2007/0209707 A1 | 9/2007 | Weltman |
| 2007/0214101 A1 | 9/2007 | Wang et al. |
| 2007/0217020 A1 | 9/2007 | Li et al. |
| 2007/0235074 A1 | 10/2007 | Henley et al. |
| 2007/0249131 A1 | 10/2007 | Allen et al. |
| 2007/0268089 A1 | 11/2007 | McKenzie et al. |
| 2007/0275569 A1 | 11/2007 | Moghadam et al. |
| 2007/0277875 A1 | 12/2007 | Gadkaree et al. |
| 2007/0281172 A1 | 12/2007 | Couillard et al. |
| 2007/0281399 A1 | 12/2007 | Cites et al. |
| 2007/0290283 A1 | 12/2007 | Park et al. |
| 2008/0000497 A1 | 1/2008 | Verhaverbeke |
| 2008/0001139 A1 | 1/2008 | Augusto |
| 2008/0038908 A1 | 2/2008 | Henley |
| 2008/0044964 A1 | 2/2008 | Kamath et al. |
| 2008/0078444 A1 | 4/2008 | Atanackovic |
| 2008/0090392 A1 | 4/2008 | Singh et al. |
| 2008/0092944 A1 | 4/2008 | Rubin |
| 2008/0092947 A1 | 4/2008 | Lopatin et al. |
| 2008/0116397 A1 | 5/2008 | Yoshida et al. |
| 2008/0121275 A1 | 5/2008 | Ito et al. |
| 2008/0121276 A1 | 5/2008 | Lopatin et al. |
| 2008/0128019 A1 | 6/2008 | Lopatin et al. |
| 2008/0128641 A1 | 6/2008 | Henley et al. |
| 2008/0164819 A1 | 7/2008 | Hwang et al. |
| 2008/0179547 A1 | 7/2008 | Henley |
| 2008/0188011 A1 | 8/2008 | Henley |
| 2008/0190886 A1 | 8/2008 | Choi et al. |
| 2008/0206962 A1 | 8/2008 | Henley et al. |
| 2008/0217554 A1 | 9/2008 | Abe |
| 2008/0242065 A1 | 10/2008 | Brcka |
| 2008/0275546 A1 | 11/2008 | Storey et al. |
| 2008/0284028 A1 | 11/2008 | Greywall |
| 2008/0296261 A1 | 12/2008 | Zhao et al. |
| 2008/0318168 A1 | 12/2008 | Szot et al. |
| 2009/0014725 A1 | 1/2009 | Nakanishi |
| 2009/0042369 A1 | 2/2009 | Henley |
| 2009/0056807 A1 | 3/2009 | Chen et al. |
| 2009/0081860 A1 | 3/2009 | Zhou et al. |
| 2009/0124064 A1 | 5/2009 | England et al. |
| 2009/0124065 A1 | 5/2009 | England et al. |
| 2009/0140132 A1 | 6/2009 | Lee et al. |
| 2009/0142875 A1 | 6/2009 | Borden et al. |
| 2009/0149001 A1 | 6/2009 | Cites et al. |
| 2009/0152162 A1 | 6/2009 | Tian et al. |
| 2009/0162970 A1 | 6/2009 | Yang |
| 2009/0206275 A1 | 8/2009 | Henley et al. |
| 2009/0227061 A1 | 9/2009 | Bateman et al. |
| 2009/0227062 A1 | 9/2009 | Sullivan et al. |
| 2009/0227094 A1 | 9/2009 | Bateman et al. |
| 2009/0227095 A1 | 9/2009 | Bateman et al. |
| 2009/0227097 A1 | 9/2009 | Bateman et al. |
| 2009/0246706 A1 | 10/2009 | Hendel et al. |
| 2009/0289197 A1 | 11/2009 | Slocum et al. |
| 2009/0308439 A1 | 12/2009 | Adibi et al. |
| 2009/0308440 A1 | 12/2009 | Adibi et al. |
| 2009/0308450 A1 | 12/2009 | Adibi et al. |
| 2009/0309039 A1 | 12/2009 | Adibi et al. |
| 2009/0317937 A1 | 12/2009 | Gupta et al. |
| 2009/0324369 A1* | 12/2009 | Scollay et al. ............ 414/222.01 |
| 2010/0025821 A1 | 2/2010 | Ohmi et al. |
| 2010/0041176 A1 | 2/2010 | Sullivan et al. |
| 2010/0055874 A1 | 3/2010 | Henley |
| 2010/0059362 A1 | 3/2010 | Anella |
| 2010/0062589 A1 | 3/2010 | Anella et al. |
| 2010/0062674 A1 | 3/2010 | Muraki |
| 2010/0087028 A1* | 4/2010 | Porthouse et al. ............ 438/61 |
| 2010/0096084 A1 | 4/2010 | Lee et al. |
| 2010/0110239 A1 | 5/2010 | Ramappa et al. |
| 2010/0124799 A1 | 5/2010 | Blake et al. |
| 2010/0159120 A1 | 6/2010 | Dzengeleski et al. |
| 2010/0167511 A1 | 7/2010 | Leung et al. |
| 2010/0170440 A9 | 7/2010 | Mizukami et al. |
| 2010/0178723 A1 | 7/2010 | Henley |
| 2010/0180945 A1 | 7/2010 | Henley et al. |
| 2010/0181654 A1 | 7/2010 | Fujiwara |
| 2010/0184243 A1 | 7/2010 | Low et al. |
| 2010/0184248 A1 | 7/2010 | Hilali et al. |
| 2010/0187611 A1 | 7/2010 | Schiwon |
| 2010/0196626 A1 | 8/2010 | Choi et al. |
| 2010/0197125 A1 | 8/2010 | Low et al. |
| 2010/0206713 A1 | 8/2010 | Li et al. |
| 2010/0229928 A1 | 9/2010 | Zuniga et al. |
| 2010/0240169 A1 | 9/2010 | Petti et al. |
| 2010/0240183 A1 | 9/2010 | Narazaki |
| 2010/0314552 A1* | 12/2010 | Tatemichi et al. ........ 250/453.11 |
| 2010/0323508 A1 | 12/2010 | Adibi et al. |
| 2011/0011734 A1 | 1/2011 | Marunaka et al. |
| 2011/0097824 A1 | 4/2011 | Berliner et al. |
| 2011/0116205 A1 | 5/2011 | Schlitz |
| 2011/0124186 A1 | 5/2011 | Renau et al. |
| 2011/0135836 A1 | 6/2011 | Hays et al. |
| 2011/0162703 A1 | 7/2011 | Adibi et al. |
| 2011/0192993 A1 | 8/2011 | Chun et al. |
| 2011/0272012 A1 | 11/2011 | Heng et al. |
| 2011/0309050 A1 | 12/2011 | Iori et al. |
| 2012/0021136 A1 | 1/2012 | Dzengeleski et al. |
| 2012/0080082 A1 | 4/2012 | Suh |
| 2012/0103403 A1 | 5/2012 | Misra et al. |
| 2012/0118857 A1 | 5/2012 | Tyler et al. |
| 2012/0122273 A1 | 5/2012 | Chun et al. |
| 2012/0125259 A1 | 5/2012 | Adibi et al. |
| 2012/0129325 A1 | 5/2012 | Adibi et al. |
| 2012/0138230 A1 | 6/2012 | Bluck et al. |
| 2012/0199202 A1 | 8/2012 | Prajapati |
| 2012/0258606 A1 | 10/2012 | Holland et al. |
| 2012/0305063 A1 | 12/2012 | Moslehi et al. |
| 2013/0008494 A1 | 1/2013 | Bateman |
| 2014/0166087 A1 | 6/2014 | Hieslmair et al. |
| 2014/0170795 A1 | 6/2014 | Prabhakar et al. |
| 2015/0072461 A1 | 3/2015 | Adibi et al. |

FOREIGN PATENT DOCUMENTS

| | | |
|---|---|---|
| CN | 1445604 A | 10/2003 |
| CN | 1622294 A | 6/2005 |
| CN | 1638015 | 7/2005 |
| CN | 1763916 A | 4/2006 |
| CN | 101055898 A | 10/2007 |
| CN | 101145569 A | 3/2008 |
| CN | 102099870 A | 6/2011 |
| CN | 102099923 A | 6/2011 |

(56) References Cited

FOREIGN PATENT DOCUMENTS

| | | |
|---|---|---|
| CN | 102150277 A | 8/2011 |
| CN | 102150278 A | 8/2011 |
| CN | 102396068 A | 3/2012 |
| CN | 102804329 A | 11/2012 |
| CN | 102834905 A | 12/2012 |
| CN | 103370769 A | 10/2013 |
| DE | 4217428 | 6/1993 |
| DE | 19820152 | 11/1999 |
| EP | 1973145 A1 | 9/2008 |
| EP | 2304803 A1 | 4/2011 |
| EP | 2308060 A1 | 4/2011 |
| EP | 2319087 A1 | 5/2011 |
| EP | 2319088 A1 | 5/2011 |
| EP | 2409331 A1 | 1/2012 |
| EP | 2446458 | 5/2012 |
| EP | 2489757 A2 | 8/2012 |
| EP | 2534674 A1 | 12/2012 |
| EP | 2641266 A1 | 9/2013 |
| EP | 2777069 A2 | 9/2014 |
| JP | S57132373 A | 8/1982 |
| JP | S62-15864 A | 1/1987 |
| JP | S62237766 A | 10/1987 |
| JP | 63-143876 A | 6/1988 |
| JP | H01-290267 A | 11/1989 |
| JP | H02-201972 A | 8/1990 |
| JP | H04-221059 A | 8/1992 |
| JP | H06-47324 A | 2/1994 |
| JP | H07-135329 A | 5/1995 |
| JP | 8-298247 A | 11/1996 |
| JP | H09-321327 A | 12/1997 |
| JP | H10-084125 A | 3/1998 |
| JP | 2000-123778 A | 4/2000 |
| JP | 2001-189483 A | 7/2001 |
| JP | 2001-252555 A | 9/2001 |
| JP | 2002-083981 A | 3/2002 |
| JP | 2002-217430 A | 8/2002 |
| JP | 2002-540548 A | 11/2002 |
| JP | 2004-031648 A | 1/2004 |
| JP | 2004-039751 A | 2/2004 |
| JP | 2004-193350 A | 7/2004 |
| JP | 2004-273826 A | 9/2004 |
| JP | 2005-005376 A | 1/2005 |
| JP | 2005-123447 A | 5/2005 |
| JP | 2005-129597 A | 5/2005 |
| JP | 2005-322780 A | 11/2005 |
| JP | 2006-196752 A | 7/2006 |
| JP | 2006-310373 A | 11/2006 |
| JP | 2007-053386 A | 3/2007 |
| JP | 2007-504622 A | 3/2007 |
| JP | 2009-049443 | 3/2009 |
| JP | 2009-129611 A | 6/2009 |
| JP | 2011-524638 A | 9/2011 |
| JP | 2011-524639 A | 9/2011 |
| JP | 2011-524640 A | 9/2011 |
| JP | 2011-525301 A | 9/2011 |
| JP | 2012-521642 A | 9/2012 |
| JP | 2012-231520 A | 11/2012 |
| JP | 2012-531520 A | 12/2012 |
| JP | 2014-502048 | 1/2014 |
| JP | 5520290 B2 | 6/2014 |
| KR | 10-2007-0043157 A | 4/2007 |
| KR | 100759084 | 9/2007 |
| KR | 20110042051 A1 | 4/2011 |
| KR | 20110042052 A | 4/2011 |
| KR | 20110042053 A1 | 4/2011 |
| KR | 20110050423 A1 | 5/2011 |
| KR | 20120027149 A1 | 3/2012 |
| KR | 20120034664 A1 | 4/2012 |
| KR | 20120137361 A | 12/2012 |
| KR | 20130129961 A | 11/2013 |
| SG | 176547 A1 | 1/2012 |
| SG | 183267 A1 | 9/2012 |
| SG | 186005 A1 | 12/2012 |
| SG | 190332 A1 | 6/2013 |
| TW | 428216 B | 4/2001 |
| TW | 200933797 A | 8/2009 |
| TW | 201232796 A1 | 8/2012 |
| TW | 201320229 A | 5/2013 |
| WO | 02075816 A1 | 9/2002 |
| WO | 2006/019039 A1 | 2/2006 |
| WO | 2007142865 | 12/2007 |
| WO | 2008009889 A1 | 1/2008 |
| WO | 2009033134 A2 | 3/2009 |
| WO | 2009033134 A3 | 3/2009 |
| WO | 2009064867 A2 | 5/2009 |
| WO | 2009064867 A3 | 5/2009 |
| WO | 2009064872 A2 | 5/2009 |
| WO | 2009064872 A3 | 5/2009 |
| WO | 2009064875 A1 | 5/2009 |
| WO | 2009085948 A2 | 7/2009 |
| WO | 2009085948 A3 | 7/2009 |
| WO | 2009111665 A2 | 9/2009 |
| WO | 2009111665 A3 | 9/2009 |
| WO | 2009111666 A2 | 9/2009 |
| WO | 2009111666 A3 | 9/2009 |
| WO | 2009111667 A2 | 9/2009 |
| WO | 2009111667 A3 | 9/2009 |
| WO | 2009111668 A2 | 9/2009 |
| WO | 2009111668 A3 | 9/2009 |
| WO | 2009111668 A9 | 9/2009 |
| WO | 2009111669 A2 | 9/2009 |
| WO | 2009111669 A3 | 9/2009 |
| WO | 2009152365 A1 | 12/2009 |
| WO | 2009152368 A1 | 12/2009 |
| WO | 2009152375 A1 | 12/2009 |
| WO | 2009152378 A1 | 12/2009 |
| WO | 2009155498 A2 | 12/2009 |
| WO | 2009155498 A3 | 12/2009 |
| WO | 2010030588 A2 | 3/2010 |
| WO | 2010030645 A2 | 3/2010 |
| WO | 2010030645 A3 | 3/2010 |
| WO | 2010108151 A1 | 9/2010 |
| WO | 2010147997 A2 | 12/2010 |
| WO | 2011005582 A1 | 1/2011 |
| WO | 2011100363 A1 | 8/2011 |
| WO | 2012068417 A1 | 5/2012 |
| WO | 2013070978 A2 | 5/2013 |
| WO | 2014100043 A1 | 6/2014 |
| WO | 2014100506 A1 | 6/2014 |

OTHER PUBLICATIONS

Restriction Requirement in U.S. Appl. No. 13/719,145, mailed on Dec. 10, 2014.
Fourth Office Action in Chinese Application No. 200980128201.7 mailed on Oct. 24, 2014.
First Office Action and Examination Report in Chinese Patent Application No. 201080025312.8, dated Sep. 10, 2014.
Extended Search Report in European Patent Application No. 14176404.3, dated Nov. 14, 2014.
Horzel, J. et al., "A Simple Processing Sequence for Selective Emitters", IEEE, 26th PVSC Conference Record of the Twenty-Sixth Photovoltaic Specialists Conference, Sep. 30-Oct. 3, 1997, Anaheim, CA, pp. 139-142.
Mouhoub, A. et al., "Selective Emitters for Screen Printed Multicrystalline Silicon Solar Cells", Rev. Energ. Ren.: ICPWE, 2003, pp. 83-86.
Szlufcik, J. et al., "Advanced concepts of industrial technologies of crystalline silicon solar cells", Interuniversity Microelectronics Centre (IMEC) Leuven, Beligium, OPTO-Electronics Review, vol. 8, Issue 4, 2000, pp. 299-306.
Extended Search Report in European Patent Application No. 12847303.0, dated Dec. 16, 2014.
First Office Action and Examination Report in Chinese Patent Application No. 201180018217.X, dated Nov. 3, 2014.
Steckl, "Particle-beam Fabrication and in Situ Processing of Integrated Circuits", IEEE Xplore, Dec. 1986, vol. 74, Issue 12.
International Search Report and Written Opinion for PCT/US2013/075869 mailed on Apr. 16, 2014.
Decision for Rejection in Japanese Patent Application No. 2011-513705 mailed on Jan. 7, 2014.

(56) References Cited

OTHER PUBLICATIONS

Decision for Rejection in Japanese Patent Application No. 2012-501017 mailed on Apr. 22, 2014.
Extended Search Report in European Patent Application No. 11742754.2 dated Apr. 28, 2014.
International Search Report and Written Opinion for PCT/US2013/76741 mailed on Apr. 18, 2014.
Second Chinese Office Action in Application No. 201080012752.X mailed on Jan. 8, 2014.
Japanese Office Action in Application No. 2012-501017 mailed Nov. 26, 2013.
Written Opinion in Singapore Patent Application No. 201106457-3 dated May 10, 2012.
Examination Report in Singapore Patent Application No. 201106457-3 dated Jan. 18, 2013.
Office Action in U.S. Appl. No. 12/821,053 mailed on Mar. 15, 2012.
Office Action in U.S. Appl. No. 12/821,053 mailed on Aug. 17, 2012.
Office Action in U.S. Appl. No. 12/821,053 mailed on Jan. 16, 2013.
Office Action in U.S. Appl. No. 12/821,053 mailed on Aug. 13, 2013.
Advisory Action in U.S. Appl. No. 12/821,053 mailed on Jan. 9, 2014.
Notice of Allowance in U.S. Appl. No. 12/821,053 mailed on Feb. 27, 2014.
Written Opinion and Search Report in Singapore Patent Application No. 201107307-9 mailed on May 17, 2013.
Examination Report in Singapore Patent Application No. 201107307-9 mailed on Jan. 2, 2014.
International Search Report and Written Opinion in International Application No. PCT/US10/39690 dated Oct. 7, 2010.
International Preliminary Report on Patentability for PCT/US10/39690 mailed on Jan. 12, 2012.
Korean Office Action in Application No. 10-2011-7030721 dated Nov. 21, 2013.
Office Action in U.S. Appl. No. 13/363,341 mailed on Apr. 5, 2013.
Office Action in U.S. Appl. No. 13/363,341 mailed Nov. 25, 2013.
Restriction Requirement in U.S. Appl. No. 13/363,347 mailed on Jul. 9, 2013.
Notice of Allowance in U.S. Appl. No. 13/363,347 mailed on Nov. 21, 2013.
Restriction Requirement in U.S. Appl. No. 13/024,251 mailed on Jun. 19, 2013.
Office Action in U.S. Appl. No. 13/024,251 mailed Jan. 28, 2014.
International Search Report and Written Opinion for PCT/US2011/24244 mailed on Apr. 6, 2011.
International Preliminary Report on Patentability for PCT/US2011/24244 mailed on Aug. 23, 2012.
Second Office Action in Japanese Application No. 2011-513706, mailed on Apr. 1, 2014.
Kim, D-M. et al., "Dopant activation after ion shower doping for the fabrication of low-temperature poly-SI TFTs", Thin Solid Films, Elsevier-Sequoia S.A. vol. 475, No. 1-2, Mar. 22, 2005 pp. 342-347.
Kim, H.J. et al., "Construction and characterization of an amorphous silicon flat-panel detector based on ion-shower doping process", Nuclear Instruments & Methods in Physics Research, Section A: Accelerators, Spectrometers, Detectors, and Associated Equipment, Elsevier Science B.V., North Holland, vol. 505, No. 1-2, Jun. 1, 2003, pp. 155-158.
Kim, K-S et al., "PH3 Ion Shower Implantation and Rapid Thermal Anneal with Oxide Capping and Its Application to Source and Drain Formation of a Fully Depleted Silicon-on-Insulator Metal Oxide Semiconductor Field Effect Transistor", Japanese Journal of Applied Physics, vol. 43, No. 10, Oct. 1, 2004, pp. 6943-6947.
Moon, B.Y. et al., "Fabrication of amorphous silicon p-i-n solar cells using ion shower doping technique", Solar Energy Materials and Solar Cells, vol. 49, No. 1-4, Dec. 1, 1997, pp. 113-119.
Wu, Y. et al., "Large-area shower implanter for thin-film transistors", IEE Proceedings-G Circuits, Devices and Systems, Institution of Electrical Engineers, vol. 141, No. 1, Feb. 1, 1994, pp. 23-36.
Extended Search Report in European Patent Application No. 11841747.6, mailed Jul. 24, 2014.
Restriction Requirement in U.S. Appl. No. 13/672,652, mailed on Aug. 8, 2014.
Examination Report for Taiwanese Patent Application No. 101141546 dated Sep. 16, 2014.
Decision for Rejection in Japanese Application No. 2011-513706, mailed on Sep. 2, 2014.
Office Action in Japanese Patent Application No. 2012-517699 dated Aug. 26, 2014.
Taiwan Notice of Allowance in Application No. 100141931 mailed on Oct. 2, 2014.
Final Office Action in U.S. Appl. No. 13/299,292 dated May 12, 2014.
Third Office Action in Chinese Application No. 200980128201.7 mailed on Apr. 9, 2014.
Notice of Allowance in U.S. Appl. No. 12/482,947 mailed on Jun. 25, 2014.
Decision of Rejection in Japanese Office Action in Application No. 2011-513701 mailed on Jun. 10, 2014.
Decision to Grant in Korean Office Action in Application No. 10-2011-7030721 dated May 31, 2014.
Notice of Allowance in U.S. Appl. No. 13/363,341 mailed Jun. 19, 2014.
Office Action in U.S. Appl. No. 13/024,251 mailed Jun. 23, 2014.
Notice of Allowance in U.S. Appl. No. 12/482,685 mailed on Sep. 6, 2012.
Office Action in U.S. Appl. No. 12/482,685 mailed on Jan. 28, 2013.
Office Action in U.S. Appl. No. 12/482,685 mailed on Jun. 25, 2013.
Office Action in U.S. Appl. No. 12/482,685 mailed Nov. 18, 2013.
Notice of Allowance in U.S. Appl. No. 12/482,685 mailed on Dec. 6, 2013.
International Search Report and Written Opinion for PCT/US2009/47090 mailed on Jul. 31, 2009.
International Preliminary Report on Patentability for PCT/US2009/47090 mailed on Dec. 23, 2010.
First Office Action in Chinese Application No. 200980128201.7, mailed on Dec. 5, 2012.
Second Office Action in Chinese Application No. 200980128201.7 mailed on Aug. 23, 2013.
Japanese Office Action in Application No. 2011-513699 mailed on Jul. 23, 2013.
Decision to Grant in Japanese Application No. 2011-513699 mailed on Mar. 11, 2014.
Examination Report in Singapore Application No. 201009185-8 dated Jul. 26, 2012.
Office Action in U.S. Appl. No. 12/482,947 mailed on Jun. 7, 2012.
Office Action in U.S. Appl. No. 12/482,947 mailed on Nov. 13, 2013.
International Search Report and Written Opinion for PCT/US2009/47094 mailed on Oct. 2, 2009.
International Preliminary Report on Patentability for PCT/US2009/47094 mailed on Dec. 23, 2010.
Extended Search Report in European Application No. 09763656.7, dated Sep. 13, 2013.
Chinese Office Action in Application No. 200980127944.2 mailed on Feb. 16, 2013.
Japanese Office Action in Application No. 2011-513701 mailed on Jan. 7, 2014.
Written Opinion in Singapore Application No. 201009193-2 mailed on Mar. 18, 2013.
Restriction Requirement in U.S. Appl. No. 12/482,980 dated Apr. 24, 2012.
Office Action in U.S. Appl. No. 12/482,980 mailed on Aug. 24, 2012.
Office Action in U.S. Appl. No. 12/482,980 mailed on Feb. 27, 2013.
Advisory Action in U.S. Appl. No. 12/482,980 mailed on Apr. 9, 2013.
International Search Report and Written Opinion for PCT/US2009/47102 mailed on Aug. 4, 2009.
International Preliminary Report on Patentability for PCT/US2009/47102 mailed on Dec. 23, 2010.
Chinese Office Action in Application No. 200980127945.7 mailed on Aug. 31, 2012.
Chinese Office Action in Application No. 200980127945.7 mailed on Jul. 25, 2013.

(56) References Cited

OTHER PUBLICATIONS

Chinese Office Action in Application No. 200980127945.7 mailed on Jan. 13, 2014.
First Japanese Office Action in Application No. 2011-513705 mailed on Jul. 16, 2013.
Second Japanese Office Action in Application No. 2011-513705 mailed on Jan. 7, 2014.
Written Opinion in Singapore Patent Application No. 201009191-6 dated Jul. 11, 2012.
2nd Written Opinion in Singapore Patent Application No. 201009191-6 dated Jun. 14, 2013.
Examination Report in Singapore Patent Application No. 201009191-6 dated Feb. 11, 2014.
Restriction Requirement in U.S. Appl. No. 12/483,017 dated Apr. 25, 2012.
Office Action in U.S. Appl. No. 12/483,017 mailed on Sep. 25, 2012.
Office Action in U.S. Appl. No. 12/483,017 mailed on Apr. 23, 2013.
Office Action in U.S. Appl. No. 12/483,017 mailed on Oct. 4, 2013.
International Search Report and Written Opinion for PCT/US2009/47109 mailed on Jul. 29, 2009.
International Preliminary Report on Patentability for PCT/US2009/47109 mailed on Dec. 23, 2010.
Chinese Office Action in Application No. 200980128202.1 mailed on May 8, 2013.
Japanese Office Action in Application No. 2011-513706, mailed on Jul. 30, 2013.
Written Opinion in Singapore Patent Application No. 201009194-0 dated Jul. 11, 2012.
Examination Report in Singapore Application No. 201009194-0 dated Jun. 25, 2013.
Restriction Requirement in U.S. Appl. No. 12/728,105 dated Oct. 5, 2012.
Office Action in U.S. Appl. No. 12/728,105 mailed on Jan. 14, 2013.
Office Action in U.S. Appl. No. 12/728,105 mailed on May 21, 2013.
International Search Report and Written Opinion for PCT/US2010/28058 mailed on May 25, 2010.
International Preliminary Report on Patentability for PCT/US2010/28058 mailed on Sep. 29, 2011.
Chinese Office Action in Application No. 201080012752.X mailed on Aug. 8, 2013.
Anders, "Plasma and Ion Sources in Large Area Coating: A Review", Surface Coatings & Technology, Nov. 21, 2005, vol. 200, Issues: 5-6, pp. 1893-1906, Berkeley CA.
Armini et al., "A Non-Mass-Analyzed Solar Cell Ion Implanter", Nuclear Instruments and Methods in Physics Research B6 (1985) 94-99, North Holland, Amsterdam, Spire Corporation, Patriots Park, Bedford, Masachusetti 01730, USA.
Chun, M. et al., "Using Solid Phase Epitaxial Re-Growth for Ion Implantation in Solar Cell Fabrications", 26th European Photovoltaic Solar Energy Conference and Exhibition, Sep. 5, 2011 to Sep. 9, 2011, Hamburg (CCH Congress Centre & International Fair), Germany.
Com-Nougue et al., "CW CO2 Laser Annealing Associated with Ion Implantation for Production of Silicon Solar Cell Junctions", Jan. 1982, IEEE, p. 770.
Cornet et al., "A New Algorithm for Charge Deposition for Multiple-Grid Method for PIC Simulations in r-z Cylindrical Coordinates", www.sciencedirect.com, Journal of Computational Physics, Jul. 1, 2007, vol. 225, Issue: 1, pp. 808-828, Sydney, Australia.
Donnelly et al., "Nanopantography: A Method for Parallel Writing of Etched and Deposited Nanopatterns", Oct. 2009, University of Houston, Houston, TX, 36 pages.
Douglas et al., "A Study of the Factors Which Control the Efficiency of Ion-Implanted Silicon Solar Cells", IEEE Transactions on Electron Devices, vol. ED-27, No. 4, Apr. 1980, pp. 792-802.
Eaton Nova (Axcelis) 200E2 H/C Implanter, data sheet, 2 pgs., Jan. 1990.
Fu et al., "Enhancement of Implantation Energy Using a Conducting Grid in Plasma Immersion Ion Implantation of Dielectric/Polymeric Materials", Review of Scientific Instruments, vol. 74, No. 8, Aug. 2003, pp. 3697-3700.
Goeckner et al., "Plasma Doping for Shallow Junctions", Journal of Vacuum Science and Technology B, vol. 17, Issue 5, Sep. 1999, pp. 2290-2293.
"Implantation par Immersion Plasma (PULSION)", Ion Beam Services (IBS), Dec. 2008, ZI Peynier Rousset, France.
Jager-Hezel, K. "Developments for Large-Scale Production of High-Efficiency Silicon Solar Cells," Advances in Solid State Physics, vol. 34, Jan. 1994, pp. 97-113, <http://www.springerlink.com/content/982620t34312416v/>.
Janssens, et al., "Advanced Phosphorus Emitters for High Efficiency SI Solar Cells", 24th European Photovoltaic Solar Energy Conference, Sep. 21-25, 2009, Hamburg, Germany.
Kondratenko, S. et al, "Channeling Effects and Quad Chain Implantation Process Optimization for Low Energy Boron Ions," abstract, IEEE Xplore Digital Library, Issue date: Sep. 22-27, 2002, Current version date: Jan. 7, 2004, 1 pg., downloaded from ieeexplore.ieee.org/xpl/freeabs_all.jsp?arnumber=1257941.
Kroner, F. et al., "Phosphorus Ion Shower Doping System for TFT-LCD's", SPIE vol. 3014, 1997, pp. 31-37.
Kwok et al., "One-Step, Non-Contact Pattern Transfer by Direct-Current Plasma Immersion Ion Implantation", Journal of Physics D: Applied Physics, IOP Publishing, vol. 42, No. 19, Sep. 2009, pp. 1-6.
Kwok et al. ""One-Step Non-Contact Pattern Transferring by Plasma Based Ion Implantation"", Journal of Physics D: Applied Physics, IOP Publishing, vol. 41, No. 22, Oct. 2008, pp. 1-6.
"Leading Semiconductor Manufacturer Selects Axcelis HE3 Ion Implantation Equipment; 300 mm Facility to Choose Axcelis Platform for High Energy Implant," Business Wire, Oct. 17, 2000, 1 pg.
Minnucci et al., "Tailored Emitter, Low-Resistivity, Ion-Implanted Silicon Solar Cells", IEEE Transactions on Electron Devices, vol. ED-27, No. 4, Apr. 1980, pp. 802-806.
Mishima, Y. et al., "Non-mass-separated ion shower doping of polycrystalline silicon", J. Appl. Phys. vol. 75, No. 10, 1994, pp. 4933-4938.
Nakamoto, I. et al., "Ion Shower Doping System for TFT-LCD's", SPIE vol. 3014, 1997, pp. 31-37.
Neuhaus et al., "Industrial Silicon Wafer Solar Cells", Hindawl Publishing Corp, vol. 2007, pp. 1-15.
Nielsen, "Ion Implanted Polycrystalline Silicon Solar Cells", Physica Scripta, vol. 24, No. 2, Aug. 1, 1981, pp. 390-391.
Nikiforov et al., Large Volume ICP Sources for Plasma-based Accelerators, Korea Elecrtrotechnology Research Institute (KERI), APAC 2004, Gyeongju, Korea.
Nitodas, S.F., et al., "Advantages of single and mixed species chaining for high productivity in high and mid-energy implantation," published Sep. 2002, Ion Implantation Technology, Current version date Jan. 7, 2004, abstract, downloaded from ieeexplore.ieee.org., 1 pg.
Pelletier et al., "Plasma-Based Ion Implantation and Deposition: A Review of Physics, Technology, and Applications", http://www.escholarship.org/uc/item/84k974r2, Lawrence Berkeley National Laboratory, May 16, 2005, pp. 1-69.
Rentsch, et al. "Technology Route Towards Industrial Application of Rear Passivated Silicon Solar Cells", Conference Record of the 2006 IEEE 4th World Conference on Photovoltaic Energy Conversion. vol. 1 (2006) pp. 1008-1011, May 2006.
Semiconductor Consulting Service publication: "Process Technology for the 21st Century," Chapter 10-Substrates, Isolation, Well and Transistor Formation, Jan. 1999, downloaded from IC Knowledge.com, http://www.icknowledge.com/our_products/pt21c.html., pp. 10-1-10-4.
Sopian et al., "Plasma Implantation for Emitter and Localized Back Surface Field (BSF) Formation in Silicon Solar Cells", European Journal of Scientific Research, http://www.eurojournals.com/ejsr.htm, ISSN 1450-216X, vol. 24, No. 3, Jan. 2008, pp. 365-372.
Tang et al., "Current Control for Magnetized Plasma in Direct-Current Plasma-Immersion Ion Implantation", American Institute of Physics, Applied Physics Letters, vol. 82, No. 13, Mar. 31, 2003, pp. 2014-2016.

(56) References Cited

OTHER PUBLICATIONS

Vervisch et al., "Plasma Immersion Ion Implantation Applied to P+N Junction Solar Cells", CP866, Ion Implantation Technology, American Institute of Physics, vol. 866, Jan. 2006, pp. 253-256.
"Varian Introduces a New High-Energy Ion Implant System for Optimized Performance and Lowest Cost of Ownership," Press Release, Business Wire, Jul. 14, 1999, 1 pg.
Walther, S.R. et al., "Using Multiple Implant Regions to Reduce Development Wafer Usage", Jan. 1, 2006, American Institute of Physics, CP866, Ion Implantation Technology, pp. 409-412.
Xu et al., "Etching of Nanopatterns in Silicon Using Nanopantography", Applied Physics Letters, vol. 92, Jan. 9, 2008, pp. 1-3.
Xu et al., ""Nanopantography: A New Method for Massively Parallel Nanopatterning Over Large Areas—, Nano Lettrs, vol. 5, No. 12, Jan. 2005, pp. 2563-2568.
Yankov et al., "Plasma Immersion Ion Implantation for Silicon Processing", Annalen der Physik, vol. 10, Issue: 4, Feb. 2001, pp. 279-298.
Young et al., "High-Efficiency Si Solar Cells by Beam Processing", Applied Physics Letters, vol. 43, Issue: 7, Oct. 1, 1983, pp. 666-668.
Younger et al, "Ion Implantation Processing for High Performance Concentrator Solar Cells and Cell Assemblies," Solar Cells, vol. 6, 1982, pp. 79-86.
Zeng et al., "Steady-State, Direct-Current (DC) Plasma Immersion Ion Implantation (PIII) for Planar Samples", IEEE, Jan. 2000, pp. 515-519.
Zeng et al., "Steady-State Direct-Current Plasma Immersion Ion Implantation Using an Electron Cycoltron Resonance Plasma Source", Thin Solid Films, www.elsevier.com/locate/tsf, vol. 390, Issues: 1-2, Jun. 30, 2001, pp. 145-148.
Restriction Requirement in U.S. Appl. No. 13/299,292 dated Aug. 13, 2013.
Office Action in U.S. Appl. No. 13/299,292 dated Nov. 13, 2013.
International Search Report and Written Opinion for PCT/US2011/61274 mailed on Mar. 29, 2012.
International Preliminary Report on Patentability for PCT/US2011/61274 mailed on May 30, 2013.
Taiwan Office Action in Application No. 100141931 mailed on Jan. 7, 2014.
International Search Report and Written Opinion in International Application No. PCT/US2012/64241 mailed on Mar. 26, 2013.
Restriction Requirement in U.S. Appl. No. 12/482,685 dated Feb. 1, 2012.
Office Action in U.S. Appl. No. 12/482,685 mailed on Feb. 28, 2012.
Office Action in U.S. Appl. No. 12/482,685 mailed on Jun. 6, 2012.
Office Action in U.S. Appl. No. 13/719,145, mailed on Mar. 30, 2015.
International Preliminary Report on Patentability for PCT/US2013/075869 mailed on Mar. 26, 2015.
International Preliminary Report on Patentability PCT/US2012/064241 mailed on May 22, 2014.
Written Opinion in Singapore Patent Application No. 11201402177X, mailed on Mar. 11, 2015.
Examination Report for Taiwanese Patent Application No. 101141546 dated Mar. 25, 2015.
Decision of Rejection in Chinese Application No. 200980128201.7 mailed on Mar. 2, 2015.
Office Action in U.S. Appl. No. 13/024,251 mailed on Feb. 10, 2015.
Extended Search Report in European Patent Application No. 12164231.8, dated Jun. 18, 2015.
Partial Search Report in European Patent Application No. 12164231.8, dated Jun. 15, 2015.
First Office Action and Examination Report in Taiwanese Patent Application No. 102147302, dated Apr. 8, 2015.
First Office Action in Chinese Patent Application No. 201180060732.4 dated May 11, 2015.
Board Opinion in Chinese Patent Application No. 200980127945.7 dated Jun. 30, 2015.
Office Action for Japanese Patent Application No. 2012-517699 dated May 12, 2015.
Second Office Action in Chinese Patent Application No. 201180018217.X, dated Jun. 9, 2015.
Office Action in U.S. Appl. No. 14/135,519 dated Jul. 9, 2015.
International Preliminary Report on Patentability for PCT/US2013/076741, mailed on Jul. 2, 2015.
Office Action in Taiwanese Patent Application No. 102147302, dated Jul. 22, 2015.
Office Action in U.S. Appl. No. 13/719,145 dated Sep. 17, 2015.
Examination Report in Singapore Patent Application No. 11201402177X dated Aug. 18, 2015.
Notice of Reasons for Preliminary Rejection for Korean Patent Application No. 10-2011-7000467 dated Jul. 26, 2015.
Notice of Allowance in U.S. Appl. No. 14/510,109 dated Oct. 15, 2015.
Office Action in U.S. Appl. No. 13/024,251 mailed on Aug. 17, 2015.
Office Action in U.S. Appl. No. 13/719,145 dated Jan. 12, 2016.
Board Opinion in Chinese Patent Application No. 200980128201.7 mailed on Dec. 4, 2015.
Board Opinion in Chinese Patent Application No. 200980127945.7 dated Dec. 29, 2015.
Decision to Grant Japanese Patent Application No. 2012-517699 dated Jan. 5, 2016.
Office Action in Chinese Patent Application No. 201180018217.X dated Oct. 19, 2015.
Notice of Allowance in U.S. Appl. No. 14/135,519 dated Nov. 18, 2015.
Second Office Action for Chinese Patent Application No. 201180060732.4 dated Jan. 29, 2016.
Notification of Grant for Chinese Patent Application No. 200980127945.7 dated Jan. 25, 2016.
Extended Search Report in European Patent Application No. 12164231.8, dated Dec. 9, 2015.
Notice of Grant for Chinese Patent Application No. 201180018217.X dated Jan. 29, 2016.

\* cited by examiner

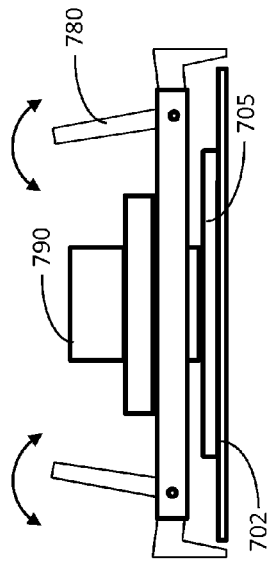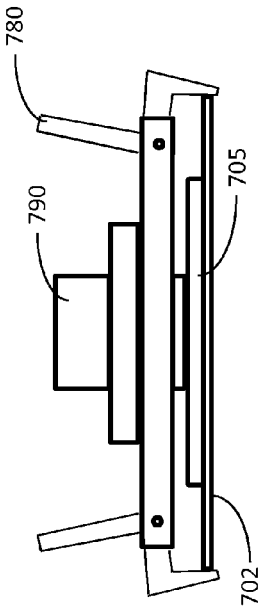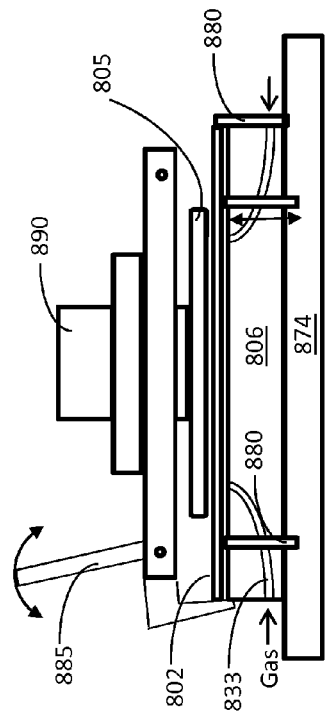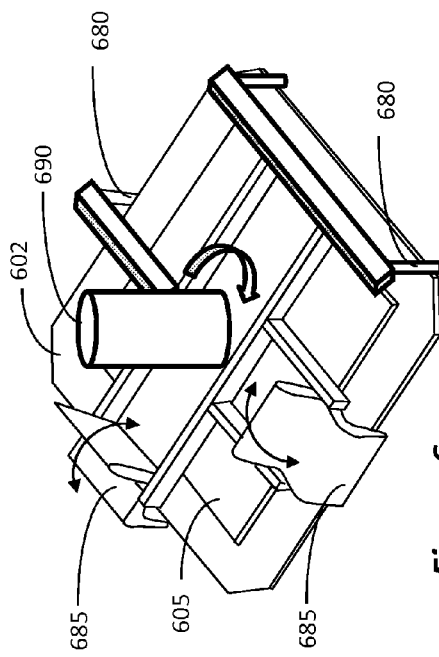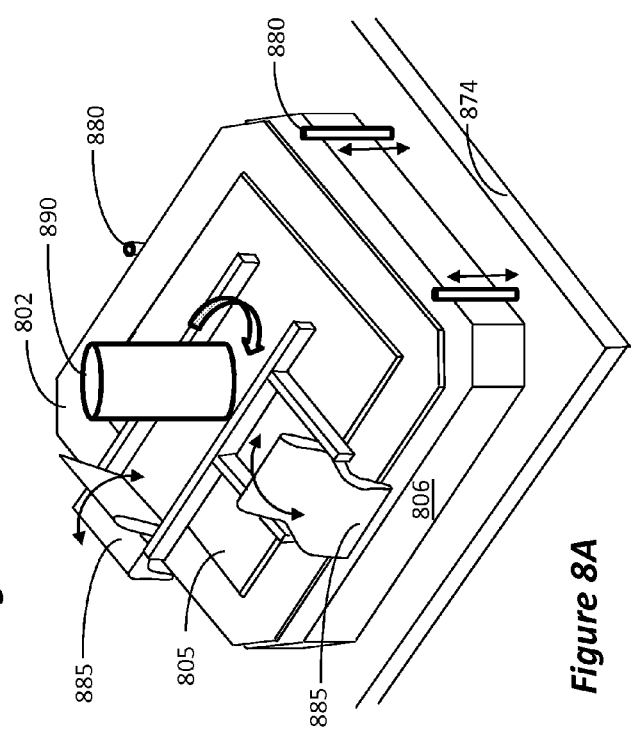

SUBSTRATE PROCESSING SYSTEM AND METHOD

RELATED CASE

This Application claims priority benefit from U.S. Provisional Application Ser. No. 61/557,363, filed on Nov. 8, 2011, the disclosure of which is incorporated here by reference in its entirety.

BACKGROUND

1. Field

This Application relates to systems and methods for substrate processing, such as silicon substrates processing to form semiconductor circuits, solar cells, flat panel displays, etc.

2. Related Art

Substrate processing systems are well known in the art. Examples of substrate processing systems include sputtering and ion implant systems. While in many such systems the substrate is stationary during processing, such stationary systems have difficulties meeting recent demand for high throughput processing. The high throughput processing is especially severe for processing substrates such as, e.g., solar cells. Accordingly, new system architectures are needed to meet this demand.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Disclosed herein is a processing system and method that enables high throughput processing of substrates. One embodiment provides a system wherein substrates continually move in front of the processing systems, e.g., the sputtering target or ion implantation beam. During travel in front of the processing system the substrate is moved at one speed, and during travel to/from load and unload positions the substrates are moved at a second speed, much higher than the first speed. This enables an overall high throughput of the system.

Various disclosed embodiments provide a vacuum processing system for processing substrates, e.g., ion implanting, using two chuck arrays. In the described embodiments each chuck array has two rows of wafers positioned on electrostatic chuck on each array, but other embodiment may use one or more rows. The arrays are mounted on opposite sides of the chamber, so that they can each have water/gas and electrical connections without interfering with the operation of the other array. The use of at least two rows on each array enables continuous processing, i.e., continuous utilization of the processing chamber without idle time. For example, by using two rows for ion implantation, the ion beam can always be kept over one chuck array while the other array is unloaded/loaded and returned to the processing position before the processed array exits the beam.

In the disclosed embodiments, all wafers on the chuck array are loaded at the same time. Wafers come from the load lock in rows, several wafers abreast, e.g., three wafers abreast. When two rows are present on the incoming conveyor, the wafers are lift up to a pick and place mechanism. In one embodiment, the pick and place mechanism uses electrostatic chucks to hold the wafers, but other mechanisms, such as vacuum, may be used. The system may optionally include dynamic wafer locating mechanisms for locating the wafer on the chucks with the correct alignment to assure that the processing is aligned to the wafer. For example, when performing ion implantation, the alignment ensures that the implanted features are perpendicular or parallel with the wafer edges.

In one embodiment, the chuck arrays have manual alignment features that are used during setup to make sure the direction of travel is parallel to the processing chamber, e.g., to implant mask features. In one example, the chuck arrays are first aligned to the implant masks by using a camera at the mask location and features on the arrays. Then each head on the pick and place mechanism is aligned to the mask by transferring an alignment wafer with precision alignment features from the input conveyor to the chuck array. The array then moves under the mask alignment camera and the angular displacement of the alignment wafer is determined. This angular displacement is then used to adjust the pick and place head. The steps are repeated until alignment is satisfactory. These steps create a fixed alignment. They are not dynamically controlled and varied by the system during wafer processing.

The pick and place heads may also have dynamic wafer alignment. For example, pawls may be used to push wafers against alignment pins while the wafer floats on a gas cushion. This gas cushion may be established by flowing gas into the chuck via the wafer cooling channels so that these channels serve a dual purpose. The alignment pins can be mounted on piezo stages for dynamic control of elevation, if needed.

In one specific example, an ion implant system is provided which comprises a vacuum enclosure, an ion implant chamber delivering an ion beam into a processing zone inside the vacuum enclosure. First and second chuck arrays are configured to ride back and forth on first and second rail assemblies, respectively, wherein an elevation mechanism is configured to change the elevation of the rail assemblies between an upper position and a lower position. Each of the first and second chuck arrays have a cantilevered portion upon which plurality of processing chucks are positioned. Each of the first and second chuck assemblies is configured to travel on its respective rail assembly in the forwards direction when the respective rail assembly is in the upper position, and ride on its respective rail assembly in the backwards direction when the respective rail assembly is in the lower position to thereby pass under the other chuck assembly.

In the described ion implant system, a delivery conveyor belt is positioned inside the vacuum enclosure on its entrance side, and a removal conveyor is position inside the vacuum chamber in its exit side. A first pickup mechanism is configured to remove wafers from the delivery conveyor and place the wafers onto the first and second chuck assemblies. A second pickup mechanism is configured to remove wafers from the first and second chuck assemblies and deliver the wafers to the removal conveyor belt. A camera is provided to enable aligning the first pickup mechanism. The camera is configured to take images of the first and second chuck assemblies while positioned in the processing zone. The images are analyzed to determine the alignment of the first pickup mechanism.

The chuck assemblies are configured to travel at one speed while in the processing zone, and at a second speed, faster than the first speed, while traveling in the reverse or backward direction. In this arrangement, when the rail assembly is in the upper position, the chuck assemblies may be traveling in either fast forward or slow forward speed, depending on the location, but always travel in the reverse fast speed when the rail assembly is in the lower position.

Each of the first and second chuck assemblies has a plurality of electrostatic chucks having gas flow channels. The first and second chuck assemblies are configured to deliver gas to the gas flow channels so as to generate gas cushion when wafers are being loaded onto the electrostatic chucks. Each of the first and second chuck assemblies also has plurality of alignment pins. Actuators may be included such that the pins may be actuated to assume an upper position for wafer alignment and thereafter assume a lower position.

Each of the first and second pickup mechanisms comprises a plurality of pickup chucks arranged to mimic the arrangement of the processing chucks on the first and second chuck assemblies. Each of the pickup chucks has associated wafer alignment actuators configured to urge against the wafers during wafer alignment procedure. The wafer alignment actuators may be configured to urge the wafers against alignment pins attached to the chuck assemblies.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 6 is a schematic view of a pickup chuck according to one embodiment.

FIG. 7A illustrates a pickup chuck with the pawls open, while FIG. 7B illustrates a pickup chuck with the pawls in the close position.

FIG. 8A is a schematic illustrating an arrangement with a pickup chuck having pawls and a processing chuck having alignment pins, while FIG. 8B is a side view of the arrangement of FIG. 8A.

DETAILED DESCRIPTION

Various embodiments disclosed herein provide a system architecture that enables high processing throughput, especially for processes such as sputtering and ion implant. The architecture enables pass-by processing, such that the substrate is being processed as it passes by the processing chamber. For example, the substrate can be passed under an ion beam such that it is being implanted as it traverses the ion beam. In some specific examples, the ion beam is made as a wide ribbon, such that it can cover sections of several substrates simultaneously. Using such an arrangement, several substrates can be passed under the beam, such that the substrates can be processed together simultaneously to increase the system's throughput.

Figure 1:
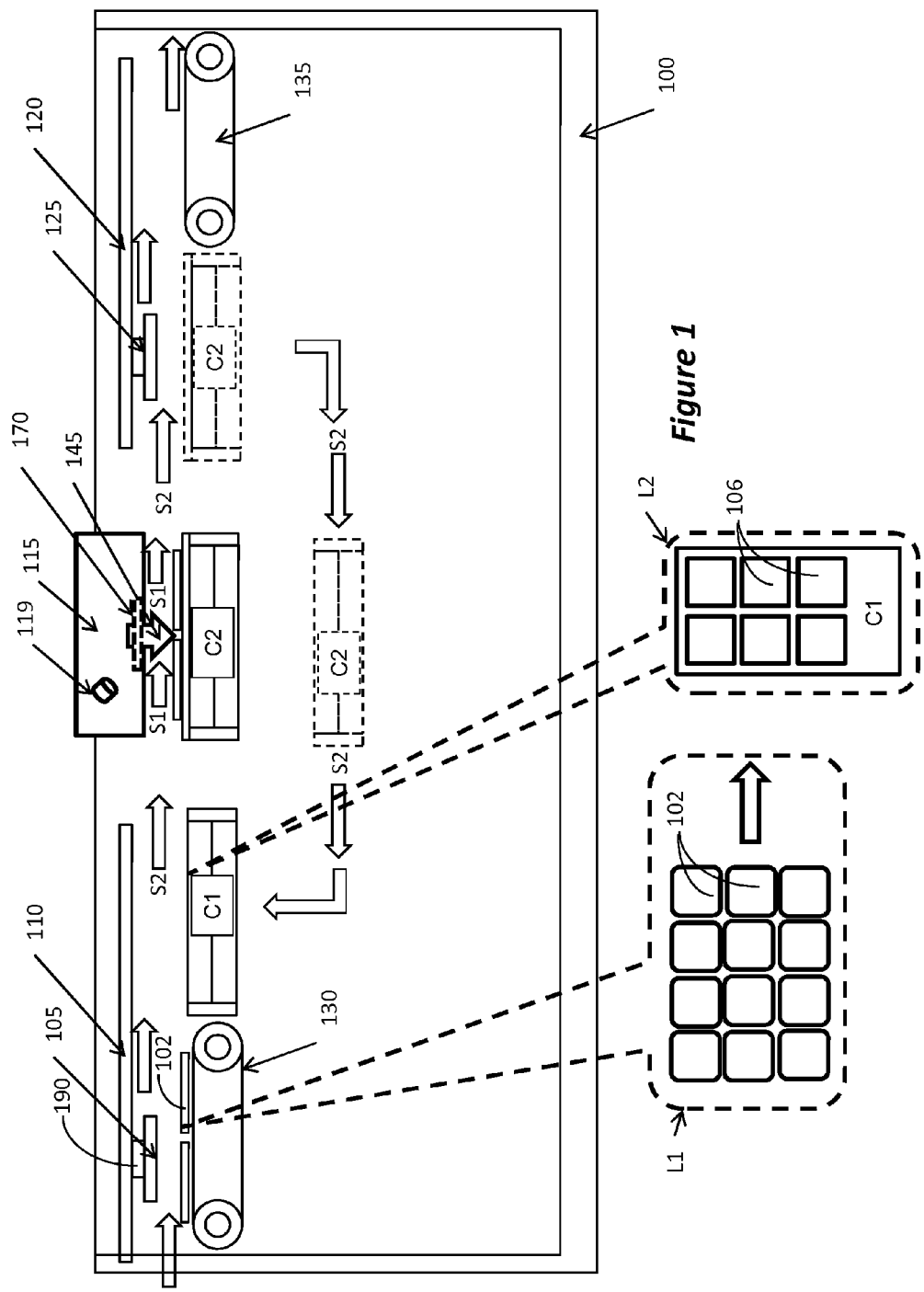
FIG. 1 is a cross-sectional schematic illustrating major parts of a system and architecture according to one embodiment.

An embodiment of the inventive sputtering chamber will now be described with reference to the drawings. FIG. 1 illustrates part of a system for processing substrates using movable chuck arrays, indicated as C1 and C2, and positioned inside vacuum enclosure 100. In FIG. 1, a processing chamber 115 is served by the two movable chuck arrays; such that at all times at least one substrate is processed by the processing chamber. The processing chamber 115 may be, for example, a sputtering chamber, an ion implant chamber, etc., having a processing zone, indicated by arrow 145. The processing zone may be, e.g., an ion beam. By having the movable chuck arrays as illustrated in FIG. 1, the processing zone is always occupied by at least one substrate, so that the chamber is never in an idle mode, but rather is always processing at least one substrate.

In the example of FIG. 1, the substrates 102 arrive on a conveyor 130 which, in this embodiment, is in vacuum. In this example, the substrates are arranged three abreast, i.e., in three rows as shown in the callout L1 of FIG. 1. Also, in this example, each chuck array has six chucks 106, arranged as a 2×3 array, as illustrated in the callout L2 of FIG. 1. A pick-up head arrangement 105 rids on an overhead rail 110 and, in this example, picks up six substrates from the conveyor simultaneously, and transfers them to the chuck array, here C1.

The wafer transport mechanism used to transport the wafers 102 from the conveyor 130 onto the processing chucks 106, employs one or more electrostatic pickup chucks 105, which are movable along tracks 110 and use electrostatic force to pick up one or more wafers, e.g., one row of three wafers 102, and transfer the wafers to the processing chucks 106. The pickup chucks 105 electrostatically chuck the wafers from their front surface, and then position the wafers on the processing chucks 106, which electrostatically chucks the wafers from their backside. Such an arrangement is particularly suitable for processing solar cells, which are rather forgiving for handling from the front surface.

Meanwhile, chuck array C2 continuously passes the processing region 145 of processing chamber 115, such that all six substrates will be exposed for processing. The motion of the chuck arrays while traversing under the processing region 145 is at a constant speed, referred to herein as S1. Once chuck array C1 has been loaded with substrates 102, it moves into processing position behind chuck array C2. This move into the processing position is done at a speed, referred to herein as S2, which is faster than speed S1, so that chuck C1 can be loaded and moved to be in position for processing before processing of the substrates on chuck array C2 is completed. Chuck array C1 then moves behind chuck array C2 at speed S1, so that when chuck array C2 exits the processing zone 145, chuck C1 immediately enters the processing zone 145. This condition is depicted as situation A in FIG. 2, wherein chuck array C2 just completed processing and chuck array C1 enters the processing zone 145. In the position illustrated in FIG. 2, chuck array C1 has just began entering the processing zone 145, for example, just started passing under the implant beam 147. Chuck array C1 will continue to move slowly at speed S1 through the implant zone 147, e.g., at about 35 mm/sec. On the other hand, chuck array C2 is just about to exit the coverage of the implant beam 147.

Figure 2:
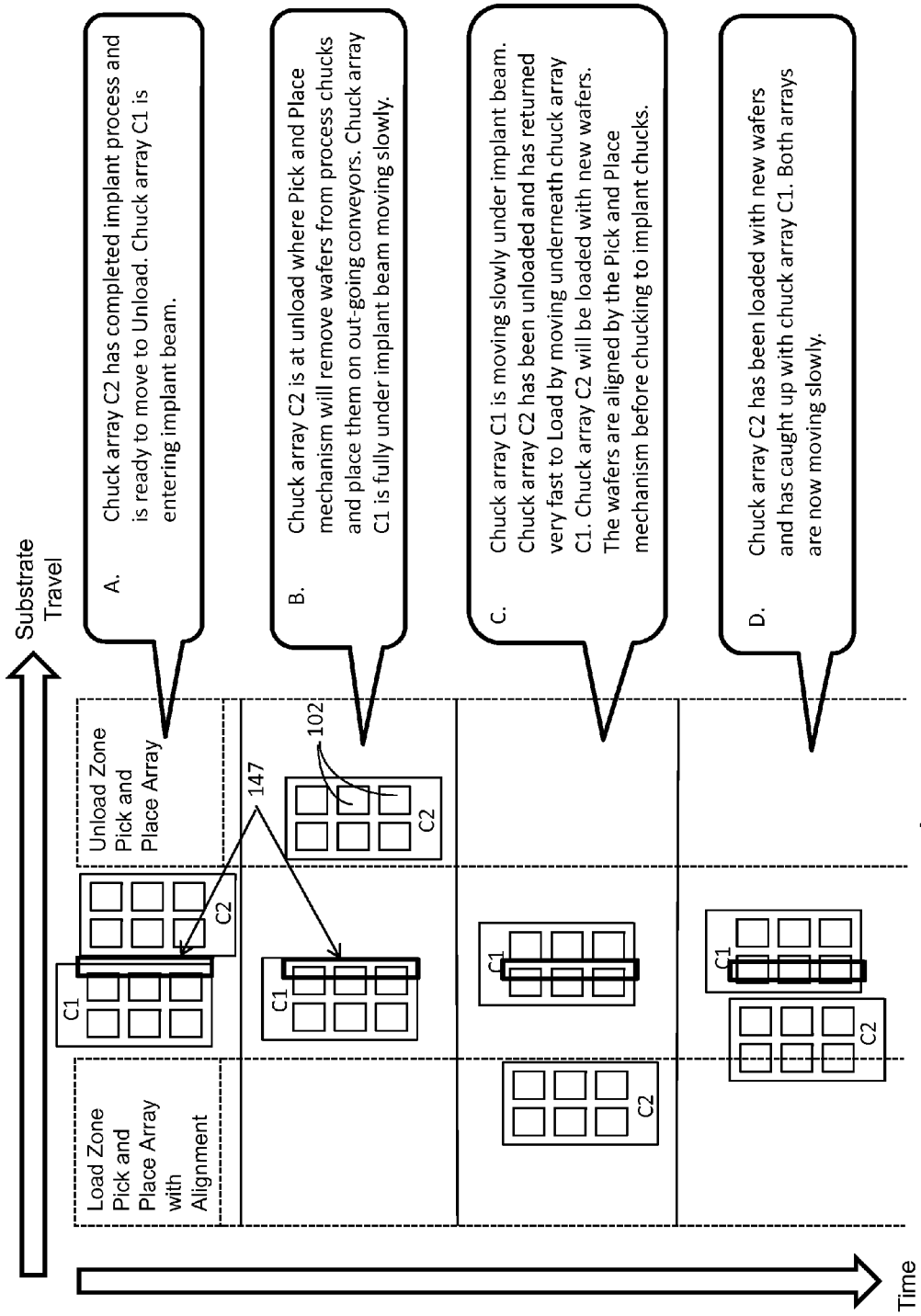
FIG. 2 is a top view of chuck arrays depicting a process flow to highlight certain features of the embodiment illustrated in FIG. 1.

Once chuck array C2 passes beyond the processing zone, i.e., exits the coverage of ion beam 147, it then accelerates and moves at speed S2 to the unloading position, depicted as situation B in FIG. 2. At this time, the front edge of chuck array C1 starts processing below the processing zone, while continuing to move at speed S1. As shown in this example, chuck array C1 is arranged such that three substrates are processed simultaneously. Of course, more or less substrates can be processed simultaneously, depending on the size of the processing zone 145, in this example, the width of the ion beam 147.

When chuck array C2 stops at the unloading station, shown in broken-line in FIG. 1, an unloading pick-up arrangement 125 picks up the substrates and moves them onto conveyor 135. Chuck array C2 is then lowered and moves at speed S2 below chuck array C1 to the load station, shown as position C in FIG. 2. When chuck array C2 is loaded with substrates, it moves into processing position behind chuck array C1, as shown in position D in FIG. 2. This cycle repeats itself, such that substrates are always present in the processing zone 145.

Figure 3A:
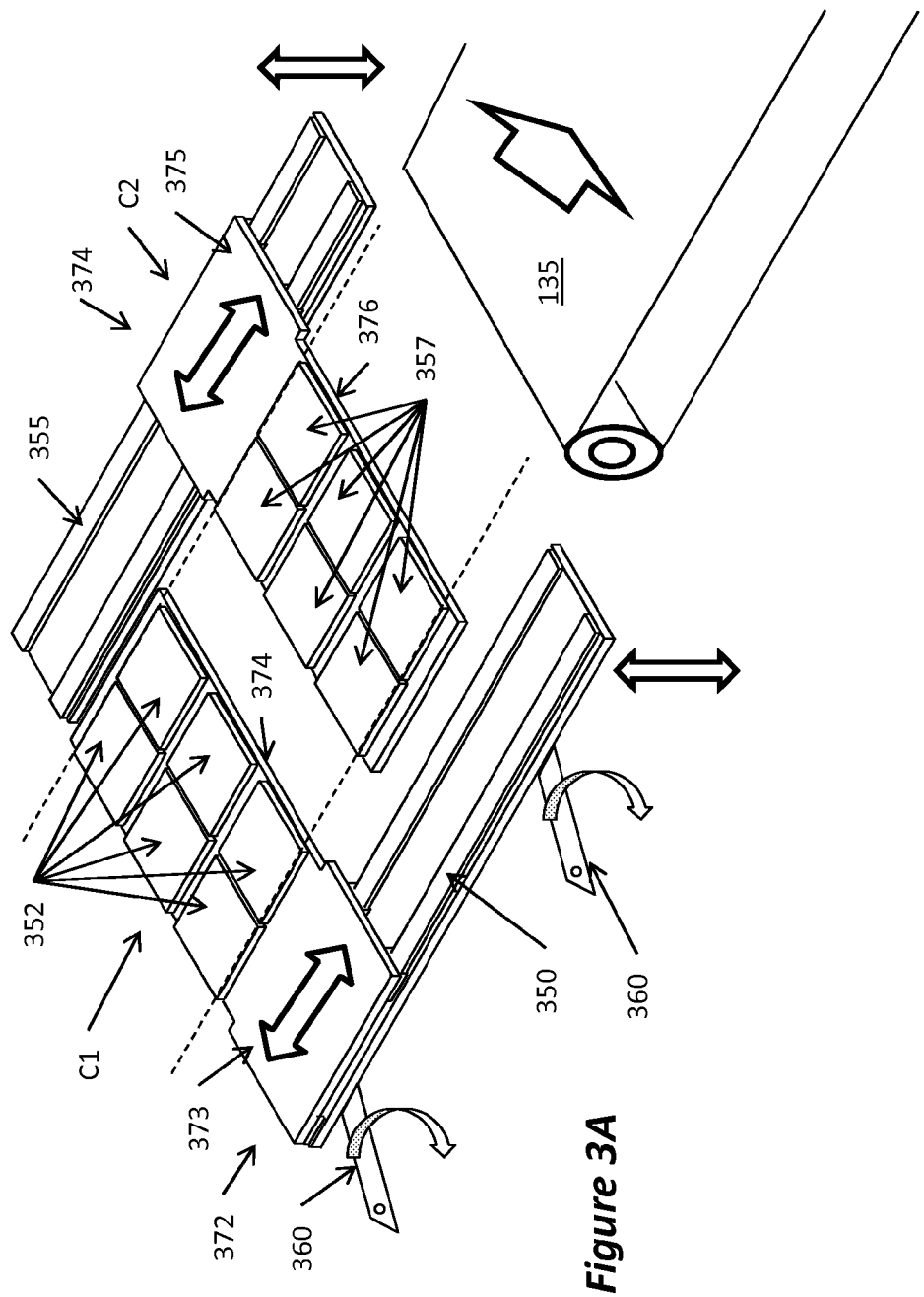
FIGS. 3A and 3B illustrate an embodiment of the chuck array system.
Figure 3B:
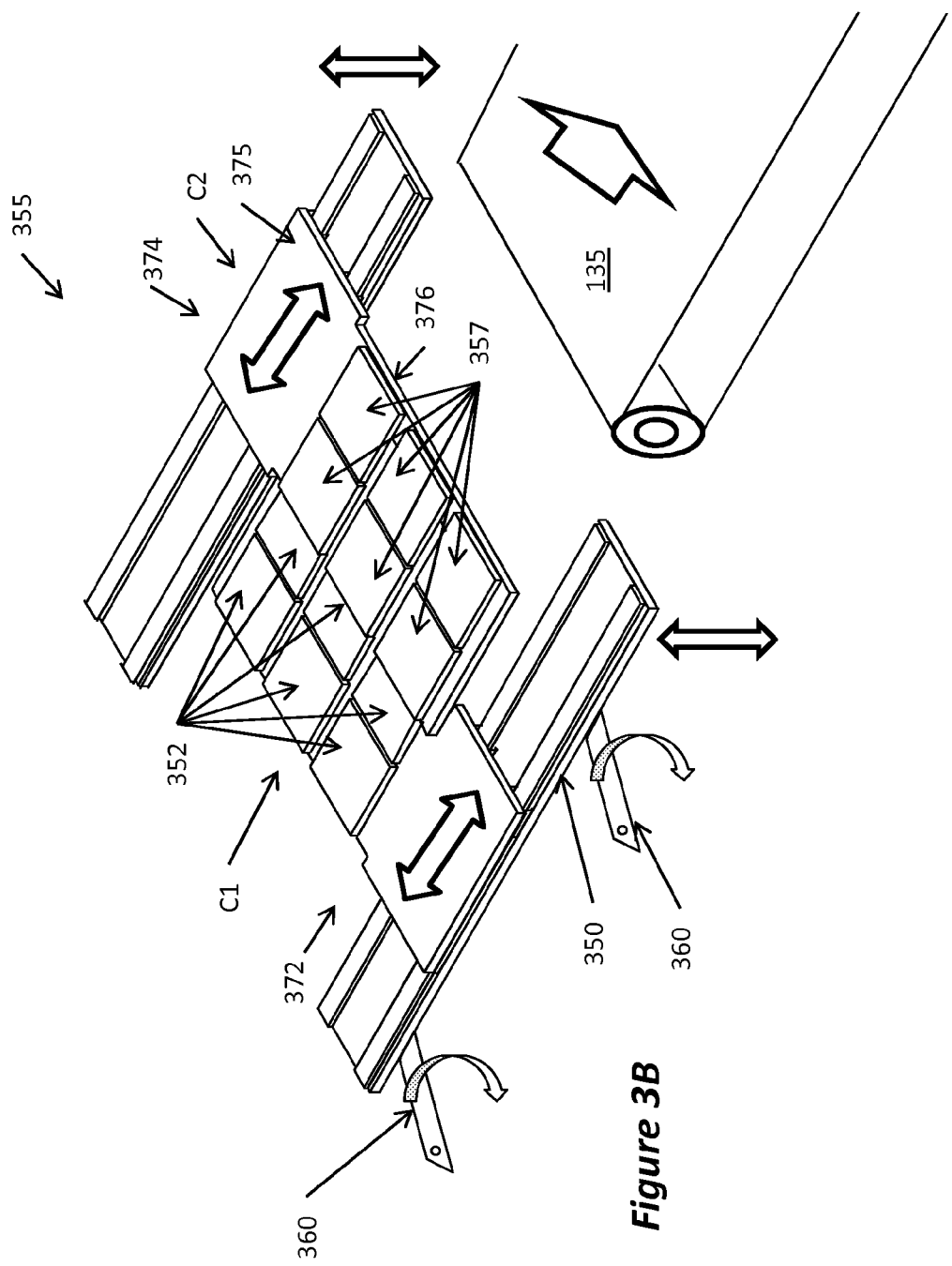

FIGS. 3A and 3B illustrate an embodiment of the chuck array system. In this embodiment, each of chuck arrays C1 and C2 has six chucks, 352, 357, each of which may be, e.g., an electrostatic chuck. Chuck array C1 rides on tracks 350 on one side, while chuck array C2 rides on tracks 355, situated in a position opposed to the tracks 350. Each of chuck arrays C1 and C2 can ride back and forth on its tracks, as indicated by the double-headed arrow. The chuck arrays C1 and C2 can be moved on tracks using motors, stepping motors, linear motors, etc. Each of the tracks is coupled to an elevation mechanism 360, which assumes an upper position and a lower position. During loading, processing, and unloading the elevation mechanism 360 is activated to have the tracks assume the upper position. FIG. 3A illustrates the condition wherein both tracks are in the upper position, such that all of the chucks are at the same level. However, during transfer from unloading position to loading position, the elevation mechanism 360 is activated to lower the respective track to assume the lower position, so that one chuck array can pass below the other. This is shown in FIG. 3B, wherein tracks 350 assume the lower position and chuck array C1 passes below chuck array C2.

As illustrated in FIGS. 3A and 3B, each chuck array has a cantilevered shelf, 372, 374, upon which the chucks are assembled. Each of the cantilevered shelves has a drive assembly 373, 375, which rides on the rails, and a free standing support assembly 374, 376, upon which the chucks are attached, and which is cantilevered from the respective drive assembly. When one rail assembly assumes the lower position, the free standing support assembly of the respective chuck assembly can pass below the free standing support assembly of the other chuck assembly. Also, as illustrated in FIG. 3, the shelves are cantilevered so that when both rails are in upper position, the chucks situated on both shelves are aligned in the travel direction, as shown by the broken lines.

Figure 4:
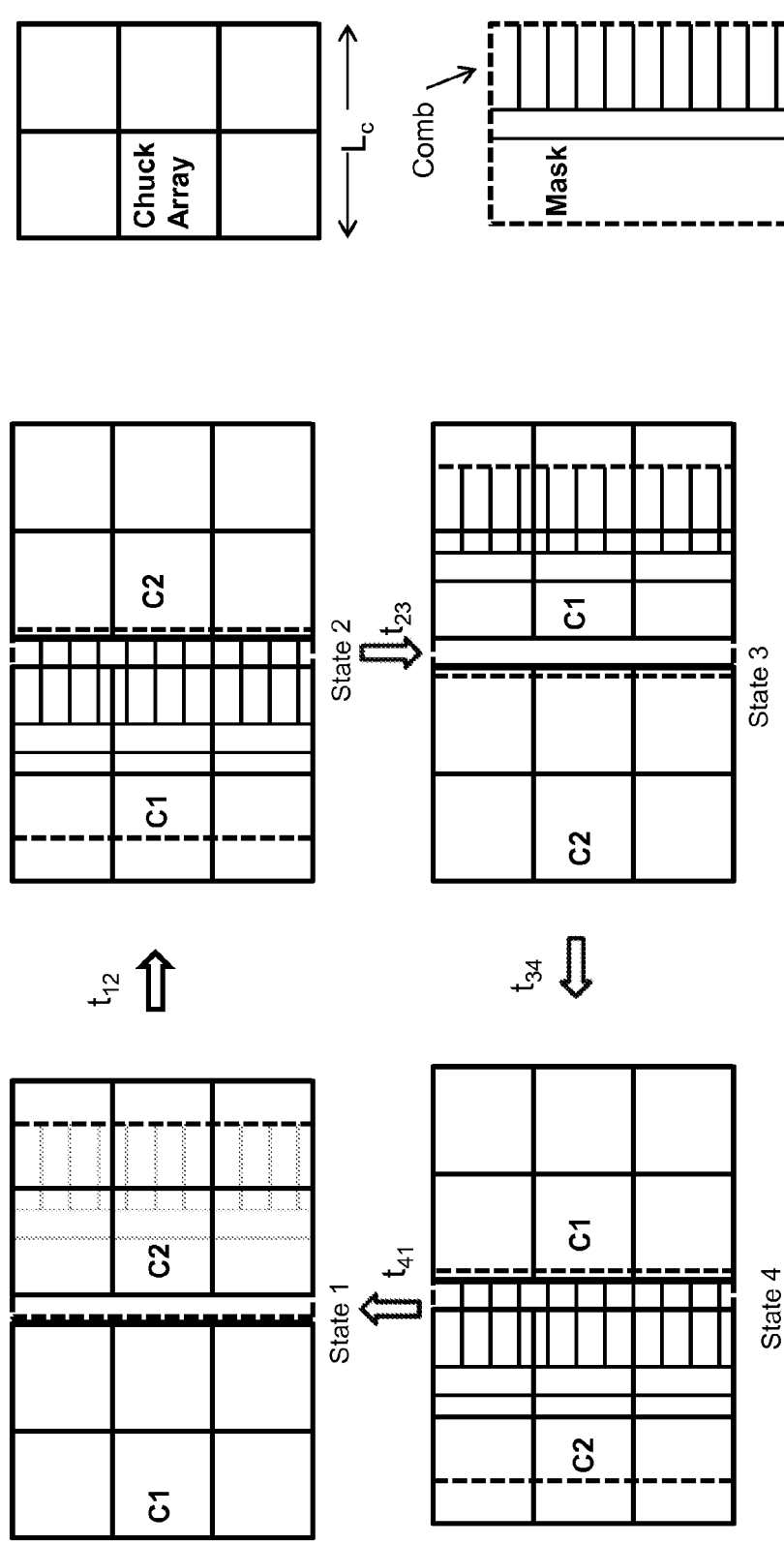
FIG. 4 illustrates an example of a system used with an ion implanter.

FIG. 4 illustrates an example of a system used with an ion implanter. The system illustrated in FIG. 4 is used for fabrication of solar cells. In the fabrication of solar cells, sometimes ion implantation is performed on only selected areas of the substrate. An example for such processing is selective emitter solar cell. According to the embodiment of FIG. 4, a mask (see, e.g., mask 170 in FIG. 1) is placed in the path of the ion beam, such that only ions that pass through holes in the mask reach the substrate. FIG. 4 illustrates how the processing using the mask proceeds and the cycle time using one numerical example.

In FIG. 4, the chuck array is shown in solid line and is illustrated to have a length Lc in the direction of travel, while the mask is shown in broken line and is illustrated to have length Lm in the direction of travel. In this arrangement, an array of 3×2 is illustrated. Such that three wafers are positioned in the width direction to be processed simultaneously. This particular mask can be used to provide even doping on the surface of the wafers, and then enhanced doping for the contact "fingers" of the solar cell. That is, as the wafers is being transported under the mask, the wide opening of the mask enables a wide uninterrupted beam of ions to pass and evenly dope the surface of three wafers simultaneously. As the wafers continue to travel and come under the "comb" section of the mask, only "beamlets" of ions are allowed to pass to the wafers to thereby dope the wafers in straight lines.

The doping process continues uninterruptedly, such that the implant source is always operational and always provides an ion beam. FIG. 4 illustrates four snapshots of four states during the continuous operation. In State 1, chuck array C2 is under the ion beam to implant the wafers positioned thereupon. The leading edge of chuck array C1 is just about to enter the area covered by the mask. Both arrays C1 and C2 travel at slow speed S1. At State 2, ion implant of the wafer positioned on chuck array C2 is completed and the trailing edge of chuck array C2 is just about to exit the area covered by the mask. Both arrays C1 and C2 still travel at slow speed S1.

Once array C2 completely exits the coverage area of the mask, during time $t_{23}$, it accelerates to speed S2 and travels to the unload station, wherein the wafers are unloaded from the array. The tracks of array C2 are then lowered and array C2 travels at speed S2 under array C1 to be loaded with fresh wafers at the loading station. Once loaded, array C2 again accelerates to speed S2 to a position just behind array C1, and then slows down to travel at speed S1 behind array C1. State 3 is a snapshot of array C2 as its leading edge is just about to enter the coverage area of the mask. Process then continues at speed S1, and, as shown in state 4, the trailing edge of chuck array C1 is about to exit the coverage area of the mask, which defines one cycle. The process then repeats itself ad infinitum, so long as wafers are loaded onto the system.

As can be understood from the example of FIG. 4, the cycle time for one chuck array is $t_{12}+t_{23}+t_{34}+t_{41}$. In one example, this cycle time is about 18 seconds. The processing time is the time from when the leading edge of the chuck array enters the mask coverage, to the time the trailing edge of the array exits the mask coverage. However, the time a chuck array travels at processing speed, i.e., S1, is longer and is shown in FIG. 4 to be $t_{12}+t_{23}+t_{34}=18-t_{41}$. On the other hand, FIG. 4 illustrates that the time the chuck array travels at speed S2 and is unloaded and loaded with new wafers is $t_{23}$, which in one example is about 6 seconds.

Figure 5:
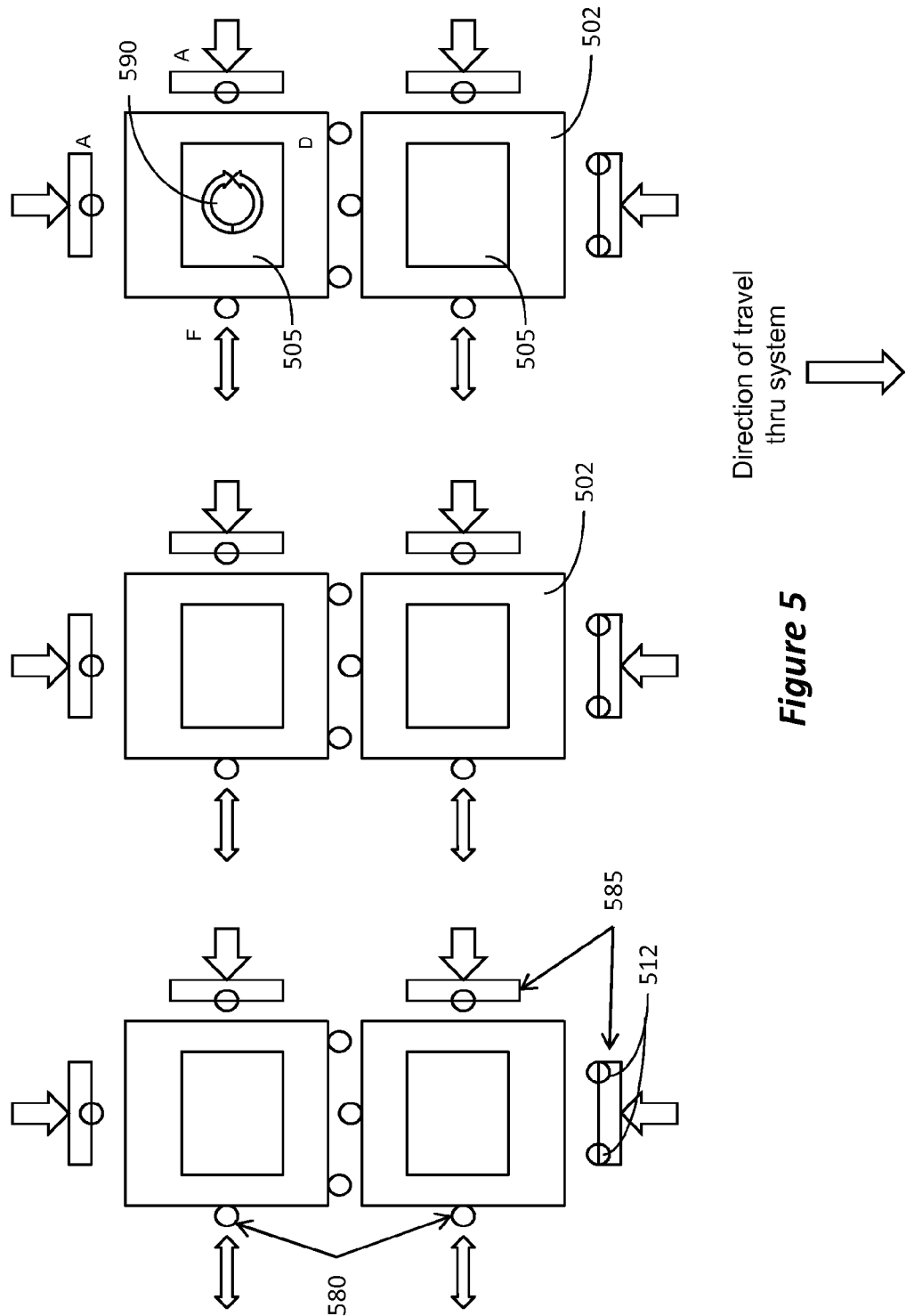
FIG. 5 illustrates a top view of the substrate loading according to one embodiment, which enables accurate alignment of the wafers to the chucks.

As can be understood from the above, for proper ion implant at high throughput speeds, the wafers need to be loaded onto the chucks at high alignment accuracy. However, since the wafers arrive on conveyor, it is difficult to maintain accurate alignment. FIG. 5 illustrates a top view of the substrate loading according to one embodiment, which enables accurate alignment of the wafers to the chucks. In this example six substrates are aligned loaded simultaneously onto six chucks.

FIG. 5 is a top view of the pick-up head 105 of FIG. 1, having a 3×2 array of electrostatic chucks 505 for simultaneously loading 6 wafers 502. Each of the chucks 505 is capable of rotational alignment about an axis, as indicated by double-arrow 590. The alignment is performed so that the wafers are aligned to the mask, and is done prior to start of processing. For example, as shown in FIG. 1, a camera 119 can be positioned near the mask 170, so as to image the mask and the chuck array. In FIG. 1, the pickup head can be rotationally aligned about axis 190. For performing the alignment, a special alignment wafer with alignment mask can be used, so its alignment to the mask can be imaged using camera 119. Once the alignment is set for a particular mask, the alignment stays static and need not be changed for each cycle. In practice, this rotational alignment is required only for the loading pick-up head 105, and is not required for the unloading pick-up head 125.

Each individual wafer is aligned to its individual processing chuck by movable pawls 585, which push the wafer against pins 580. The pawls 585 are in the open position when a wafer is picked up by the chuck 505, and then are closed, e.g., by gravity, to press the wafers against the pins 580 for alignment. The pins 580 may be fixed or may be movable by, e.g., piezo, as will be explained below. As will be described with respect to the example of FIG. 8, gas flow may be used to float the wafer as it is being aligned to the chuck.

FIG. 6 is a schematic view of a single pickup chuck of the pickup head, e.g., pickup chucks 505 of pickup head 105, according to one embodiment. As illustrated in FIG. 5, six such pickup chucks 505 can be arranged on one pickup head 105, so as to transport six wafers simultaneously. In the embodiment of FIG. 6, each pickup chuck has individual radial alignment about axis 690. For example, each time a new mask is installed on the ion implant system, each of the pickup chucks can be individually radially aligned so that when they deliver the wafers to the processing chucks, the wafers are aligned to the mask. Once alignment is completed, processing can commence and no further alignment may be required until such time as a new mask is installed.

Each wafer is held by an electrostatic chuck 605, and is aligned to the processing chuck. In one embodiment, the wafer is aligned by having static pins on two sides and movable alignment levers on the two counter-sides. In FIG. 6 static pins 680 are fixed and are arranged such that one pin is centered on one side of the wafer and two pins are provided on the adjacent side of the wafer at 90° angle. As shown in FIG. 5, the two pins are provided on the side that is the leading edge of the wafer, i.e., the side of the wafer that is the leading edge during transport of the wafer. Two movable levers, in FIG. 6 two pawls 685, push the wafer against the static pins so as to align the wafer. The levers may have defined point of contacts, e.g., pins or bumps, such that only the defined point of contact touches and urges the wafer against the static pins. As shown in FIG. 5, some pawls have only a single point of contact, while others may have two or more points of contact. In FIG. 5, the pawls that urge against the leading edge of the wafer have two points of contact 512.

FIGS. 7A and 7B illustrate an example wherein levers 780 from both sides of the wafer urge the wafer to assume an aligned position. In FIG. 7A levers 780 are in the open position, i.e., not urging the wafer 702. The wafer 702 is held by electrostatic chuck 705, which is aligned about axis 790. In FIG. 7B the levers 780 assume the close position and urge the wafer to assume an aligned position.

FIGS. 8A and 8B illustrate another embodiment, wherein the alignment is performed partly by the pickup chuck and partly by the processing chuck. In the embodiment of FIGS. 8A and 8B, the electrostatic chuck 805 is radially aligned about axis 890 and electrostatically holds wafer 802. During the time that the electrostatic chuck 805 holds wafer 802 the pawls 885 are in the open position, such that they do not urge against the wafer 802. When the pickup chuck delivers the wafer to the processing chuck 806, gas is pumped under the wafer via channels 833 in the chuck. This creates an gas cushion upon which the wafer floats. At that time, the levers 855 assume the close position, e.g., by gravity or actuators, to urge the wafer against the fixed pins 880. As, illustrated in this embodiment the fixed pins 880 are attached to the base 874 of the chuck array, upon which processing chuck 806 is mounted. Once the levers 885 have urged the wafer against the pins 880, air flow can be terminated and the processing chuck energized so as to chuck the wafer in an aligned position. Also, in this embodiment the pins 880 are movable in the z-direction, i.e., elevated for alignment and lowered during transport and processing, as illustrated by the double-headed arrow.

Figure 9:
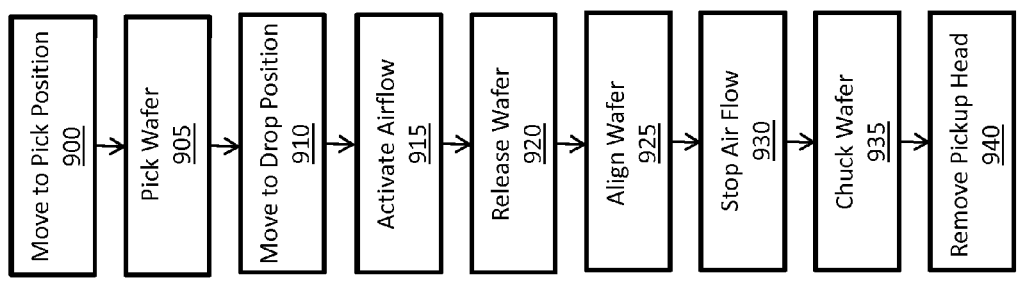
FIG. 9 is a flow chart illustrating a process for transferring a wafer onto the processing chuck.

FIG. 9 is a flow chart illustrating a process for transferring a wafer onto the processing chuck using the embodiment shown in FIGS. 8A and 8B. Similar processes can be performed using other disclosed embodiments. In the embodiments described above the transfer is performed from a conveyor belt onto a processing chuck, or vice versa, but a similar process can be performed when transferring from, e.g., a wafer cassette, a wafer tray, robot arm, etc. The process starts at step 900 by placing the pickup head at the pick up position, over the wafer to be picked up. In step 905 the pickup head is activated to pick up the wafer by, e.g., vacuum, electrostatic force, mechanical attachment, etc. In step 910 the pickup head is moved to the drop off position, e.g., over the processing chuck.

Since this process relates to the embodiment of FIGS. 8A and 8B, in step 915 gas flow is activated, so as to flow gas through the processing chuck. This step is optional and is performed only when gas flow channels are included in the processing chuck. Such gas channels are usually included in the chuck for the purpose of flowing cooling gas, such as helium, but the same arrangement can be used for the purpose of creating a gas cushion to float the wafer above the processing chuck. The gas cushion can be maintained by flowing helium, argon, nitrogen, air, etc. Also, if used, at this time the alignment pins can be elevated to their upward alignment position.

The wafer is then released onto the gas cushion at step 920 and, as the pickup head is elevated a bit over the dropped wafer, the alignment mechanism aligns the wafer over the chuck in step 925. The alignment mechanism may be static pins and movable levers or pawls as illustrated in the above embodiments. In step 930 gas flow is reduced until it stops so that the wafer can be gently lowered onto the chuck without going out of alignment, and in step 935 the wafer is chucked onto the processing chuck. This can be done by vacuum, mechanical clamping, electrostatic force, etc. At step 940 the pickup head is moved away and, if used, the alignment pins are lowered.

Figure 10:
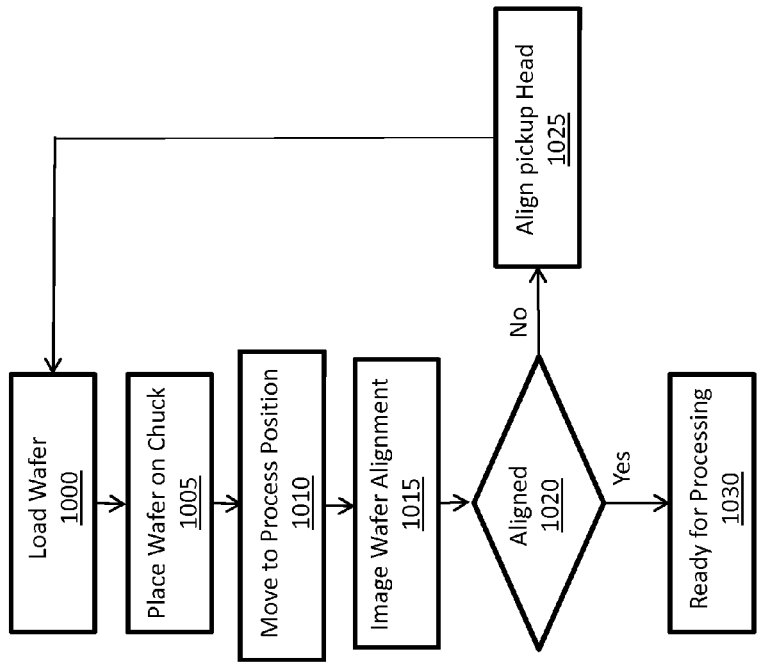
FIG. 10 is a flow chart illustrating a process for aligning the pickup head to the processing chamber.

FIG. 10 is a flow chart illustrating a process for aligning the pickup head to the processing chamber. This is done to align the radial position of the pickup head to the processing chamber, so it is done only if the process generates features on the wafer and wherein the alignment of the features to the wafer's topology is critical. Otherwise, this process need not be performed. Thus, for example, if the processing generates a uniform layer over the entire surface of the wafer, no alignment is needed. However, if the processing generates features, such as, e.g., contact fingers on a solar cell, then the alignment process may be carried out before processing commences. After the alignment is done, processing may commence without the need for further alignment.

In Step 1000 the pickup head is moved into position and loads a wafer. If multiple pickup chucks are used, then multiple wafers can be loaded. Also, in one example, a specially designed alignment wafer(s) can be used. For example, the wafer can have special marks to assist in determining proper alignment. At step 1005 the pickup head is moved to drop the wafer(s) onto the processing chuck(s). Then at step 1010 the chuck array is moved onto wafer processing position and at step 1015 an image of the chucks and/or wafers is taken. For example, if the system is used for ion implantation through a mask, the image may be of the mask, as aligned to the marks on the alignment wafers. At step 1020 the image is inspected and it is determined whether the alignment is proper. If it is not, the process proceeds to step 1025 where the proper alignment is performed to the pickup head. Then the process repeats to confirm the alignment. If at step 1020 it is determined that the alignment is proper, then at step 1030 regular processing can commence.

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

The invention claimed is:

1. A substrate processing system, comprising:
a processing chamber defining a processing zone;
a first chuck array coupled to a first transport mechanism positioned on a first side, wherein the first chuck array is configured to be linearly movable back and forth on the first transport mechanism, thereby traversing the processing zone;
a second chuck array coupled to a second transport mechanism positioned on a second side, opposite the first side, wherein the second chuck array is configured to be linearly movable back and forth on the second transport mechanism, thereby traversing the processing zone;
and wherein each of the first and second transport mechanism is configured to be movable in elevation direction to enable one of the first and second chuck arrays to pass below the other one of the first and second chuck arrays;
wherein the first transport mechanism comprises:
a first rail assembly positioned inside the vacuum enclosure on one side of the processing chamber;
a first elevation mechanism coupled to the first rail assembly and configured to raise the first rail assembly to elevated position and lower the first rail assembly to lower position;
wherein the second transport mechanism comprises:
a second rail assembly positioned inside the vacuum enclosure on opposite side of the first rail assembly;
a second elevation mechanism coupled to the second rail assembly and configured to raise the second rail assembly to elevated position and lower the second rail assembly to lower position;
wherein the first chuck array is positioned on a first cantilevered shelf configured to ride on the first rail assembly; and, wherein the second chuck array is positioned on a second cantilevered shelf configured to ride on the second rail assembly.

2. The system of claim 1, further comprising a loading mechanism configured for loading substrates onto the first and second chuck arrays.

3. The system of claim 2, further comprising unloading mechanism configured for unloading substrates onto the first and second chuck arrays.

4. The system of claim 2, wherein the loading mechanism further comprises alignment mechanism.

5. The system of claim 4, wherein each of the first and second chuck arrays comprises a plurality of electrostatic chucks.

6. The system of claim 5, wherein each of the first and second chuck arrays comprises a plurality of rows of electrostatic chucks.

7. The system of claim 4, wherein each of the first and second chuck arrays is configured to be moved at a first speed while traversing the processing zone and at a second speed, faster than the first speed, when moved outside the processing zone.

8. The system of claim 5, wherein the loading mechanism comprises a plurality of electrostatic chucks configured to chuck wafers from front side of the wafers.

9. The system of claim 8, wherein the loading mechanism comprises alignment pawl configured for urging wafers against static alignment pins.

10. The system of claim 9, further comprising an alignment camera.

11. The system of claim further comprising a wafer delivery mechanism positioned inside the vacuum enclosure and a wafer removal mechanism positioned inside the vacuum enclosure.

12. The system of claim 11, further comprising a first pick-and-place assembly configured to transfer substrates from the wafer delivery mechanism to the first and second chuck arrays, and a second pick-and-place assembly configured to transfer substrates from the first and second chuck arrays to the wafer removal mechanism.

13. The system of claim 12, wherein the wafer delivery mechanism comprises a first conveyor and the wafer removal mechanism comprises a second conveyor.

14. The system of claim 13, wherein the pick-and-place assembly comprises a pickup head having a plurality of pickup chucks configured for simultaneously chucking a plurality of wafers.

15. The system of claim 14, wherein each of the chuck array comprises a plurality of electrostatic chucks.

16. The system of claim 15, wherein the pick-and-place assembly further comprises actuators configured to align the wafers to the plurality of chucks.

17. The system of claim 16, wherein each of the chuck array comprises a plurality of alignment pins configured for aligning the substrates by urging the substrates against the alignment pins.

18. The system of claim 1, wherein each of the first and second chuck arrays comprises gas flow channels configured to generate gas cushion to float the substrates.

19. The system of claim 1, wherein the first transport mechanism and the second transport mechanism are configured to operate such that when the first chuck array exits the processing zone, the second chuck array immediately enters the processing zone and when the second chuck array exits the processing zone, the first chuck array immediately enters the processing zone.

* * * * *